(12) United States Patent
Adler et al.

(10) Patent No.: US 6,338,594 B1
(45) Date of Patent: Jan. 15, 2002

(54) MOVABLE BARRIER WALL

(75) Inventors: Richard S Adler, Upland, CA (US); David A. Evans, Lowell, MA (US); Tore Abrahamsen, San Francisco; Ferrel Ensign, North Highlands, both of CA (US); George Hayward, New York, NY (US); George Nelson, Monroe; Joseph P. McFadden, Fairfield, both of CT (US)

(73) Assignee: Richard S. Adler, Upland, CA (US)

( * ) Notice: Subject to any disclaimer, the term of this patent is extended or adjusted under 35 U.S.C. 154(b) by 0 days.

(21) Appl. No.: 09/444,238

(22) Filed: Nov. 19, 1999

Related U.S. Application Data

(60) Provisional application No. 60/117,812, filed on Jan. 30, 1999, and provisional application No. 60/109,288, filed on Nov. 20, 1998.

(51) Int. Cl.⁷ .............................. E02B 3/04; E02B 7/20
(52) U.S. Cl. ......................... 405/97; 405/87; 405/92; 405/104; 405/114
(58) Field of Search .................... 405/92, 90, 91, 405/104, 114, 96, 97, 80, 87, 93

(56) References Cited

U.S. PATENT DOCUMENTS

| | | | | |
|---|---|---|---|---|
| 1,344,043 A | * | 6/1920 | Justin | 405/96 |
| 3,339,326 A | * | 9/1967 | Derr et al. | 52/309 |
| 5,460,462 A | * | 10/1995 | Regan | 405/96 |
| 5,725,326 A | * | 3/1998 | Van Den Noort | 405/104 |

FOREIGN PATENT DOCUMENTS

| | | | | |
|---|---|---|---|---|
| DE | 19651389 A 1 | * | 6/1998 | |
| GB | 2323621 A | * | 9/1998 | |
| JP | 61-49013 | * | 3/1986 | |
| JP | 8-284139 | * | 10/1996 | |
| JP | 9-31936 | * | 2/1997 | |
| JP | 11-2077 | * | 1/1999 | |
| NL | A-9201601 | * | 4/1994 | |

* cited by examiner

Primary Examiner—David Bagnell
Assistant Examiner—John Kreck

(57) ABSTRACT

A movable barrier wall system includes a housing assembly 12 that has an interior chamber 32. A barrier member 14 is made of a buoyant material having a selected density. The barrier member 14 floats vertically within the chamber 32 when a liquid is present. The barrier member 14 may be made from a closed cell foam core 34 that is clad with a fiberglass mesh material then the assembly is infused with a resin material. Alternatively, the core 34 may be made from a plurality of elongated rods 38 that are individually clad and reinforced with a shear layer. The individual barrier member modules 15 may be assembled in an end to end relationship with an elongated vertical seal member therebetween. The barrier member 14 may be selectively raised prior to and in anticipation of a flood situation of a nearby body of water by a pump and control system that may be automatically or manually controlled. At least one passive backup system is provided for filling the chamber when the pump or control system fails. The system includes a second pump for selective removal of the liquid from the chamber 32.

91 Claims, 24 Drawing Sheets

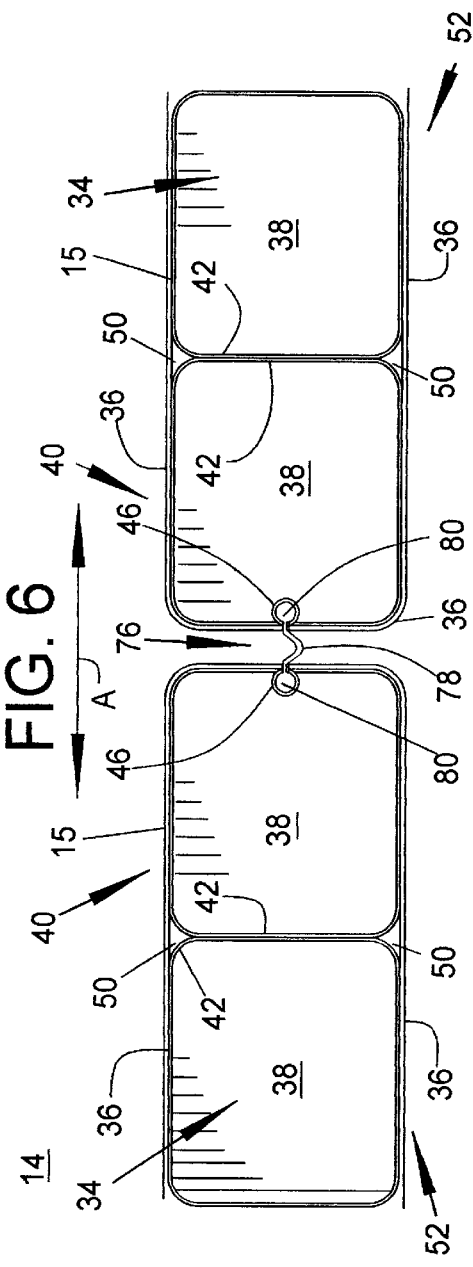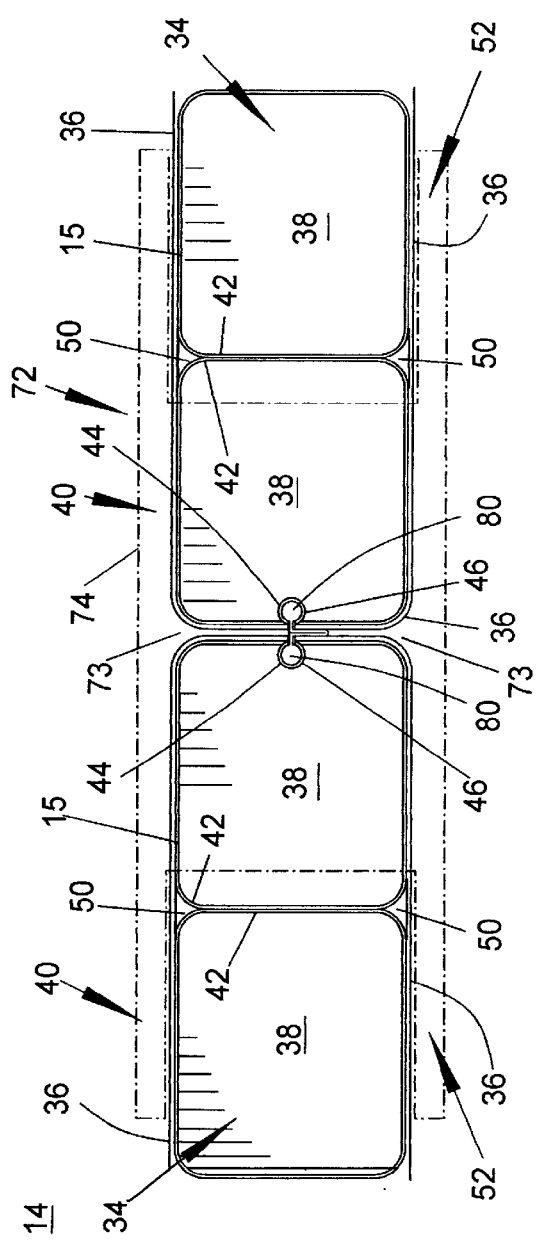

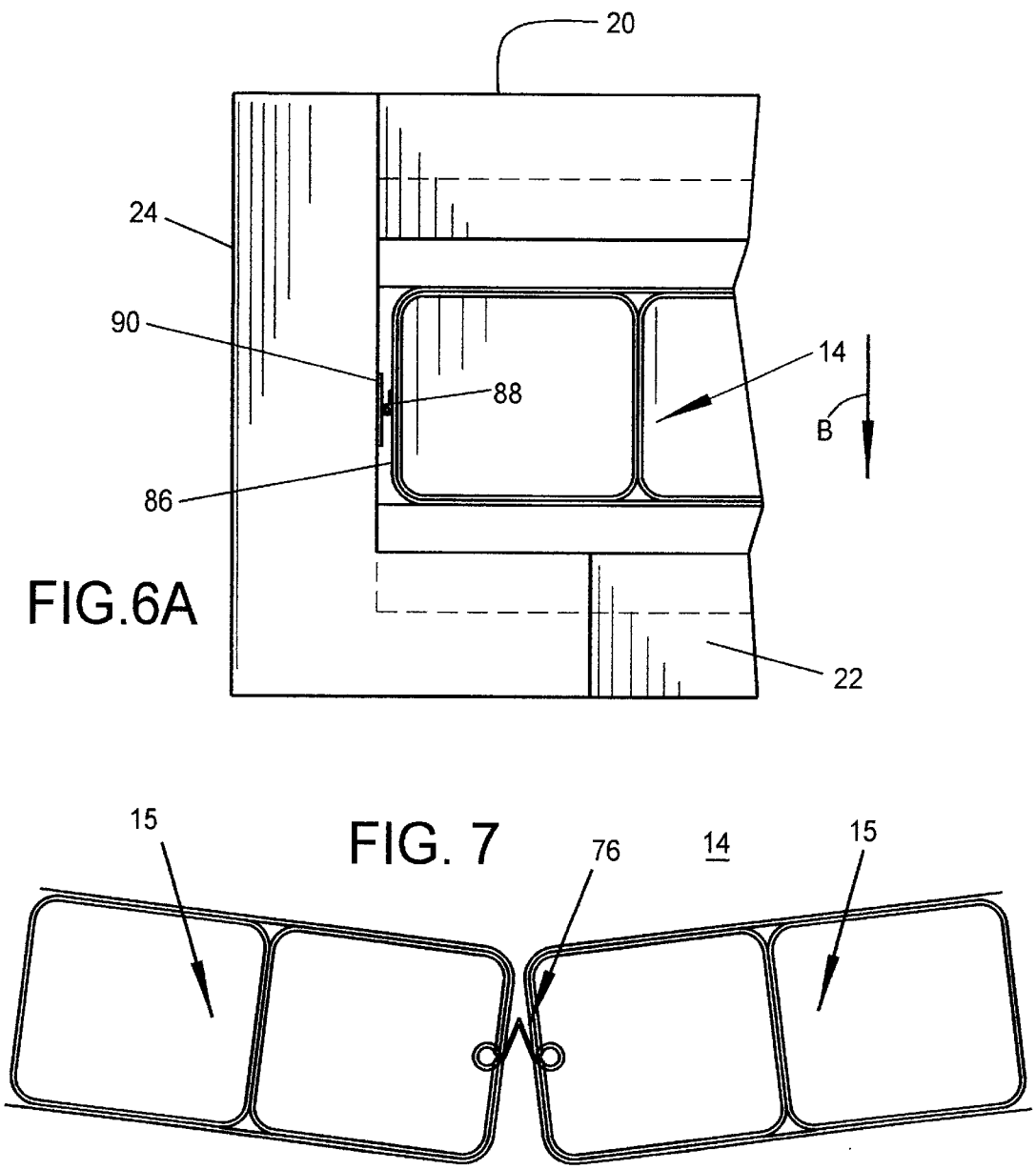

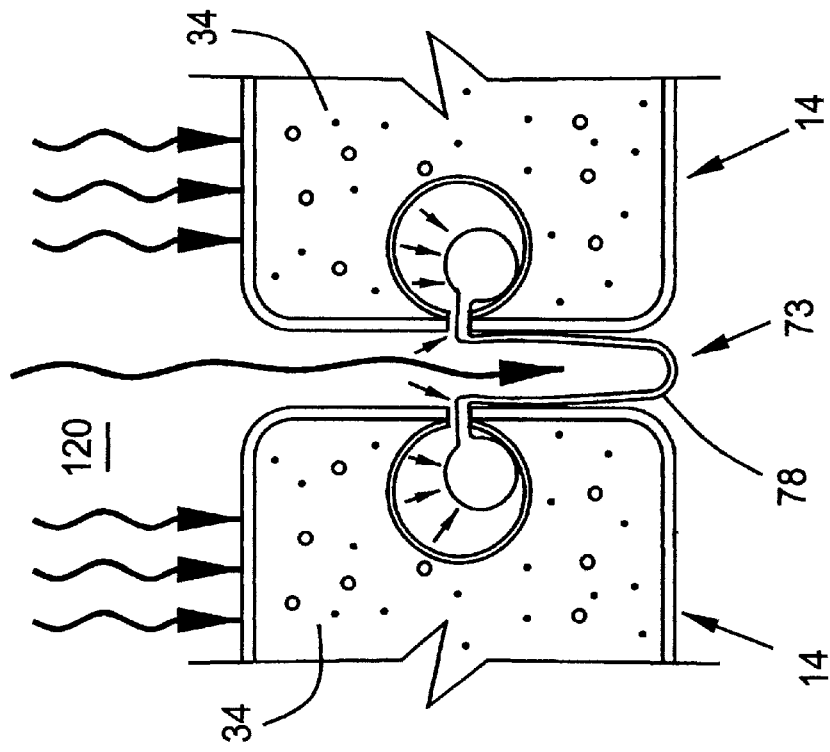
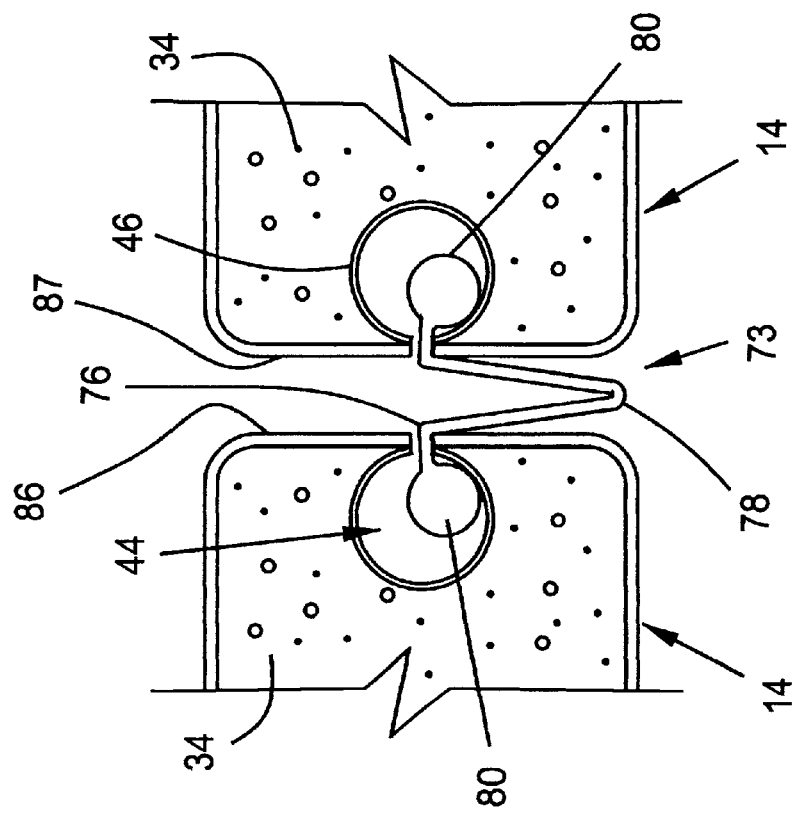
FIG. 7A

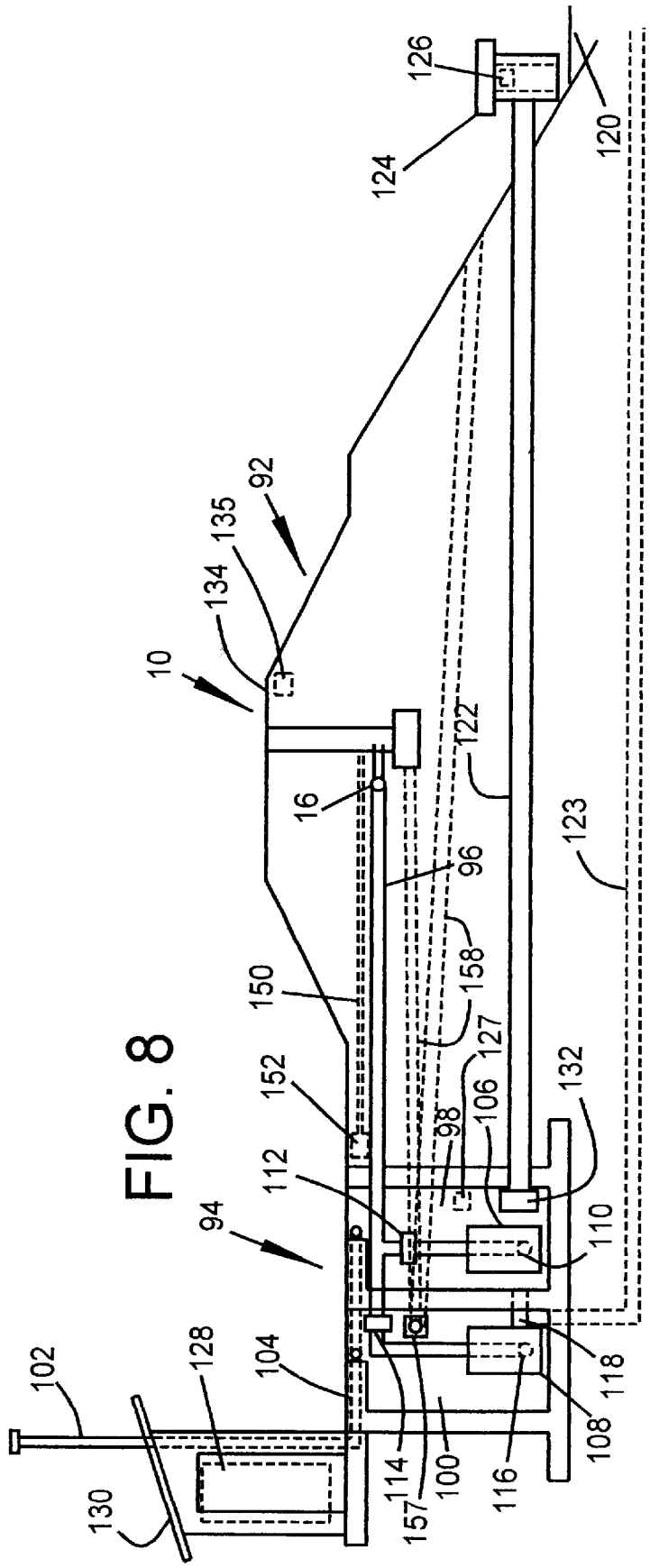

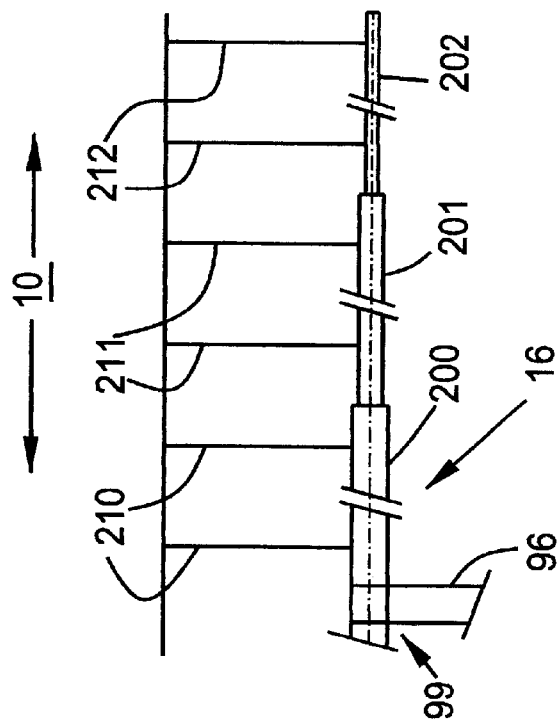
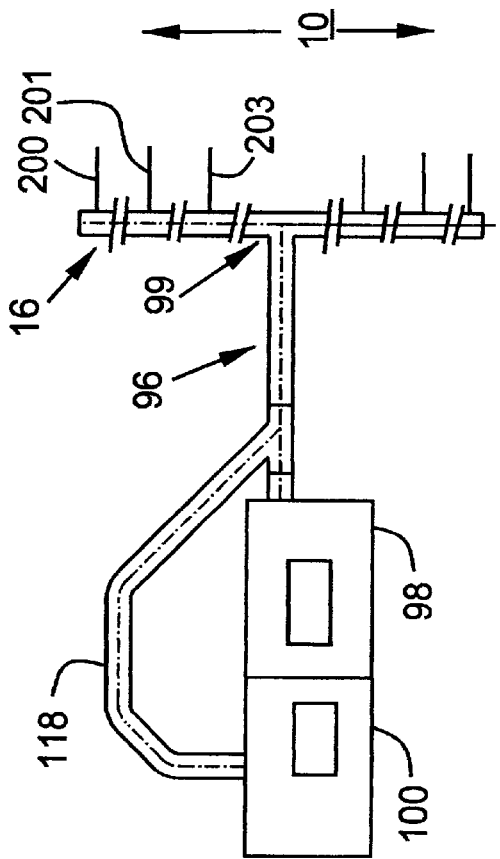

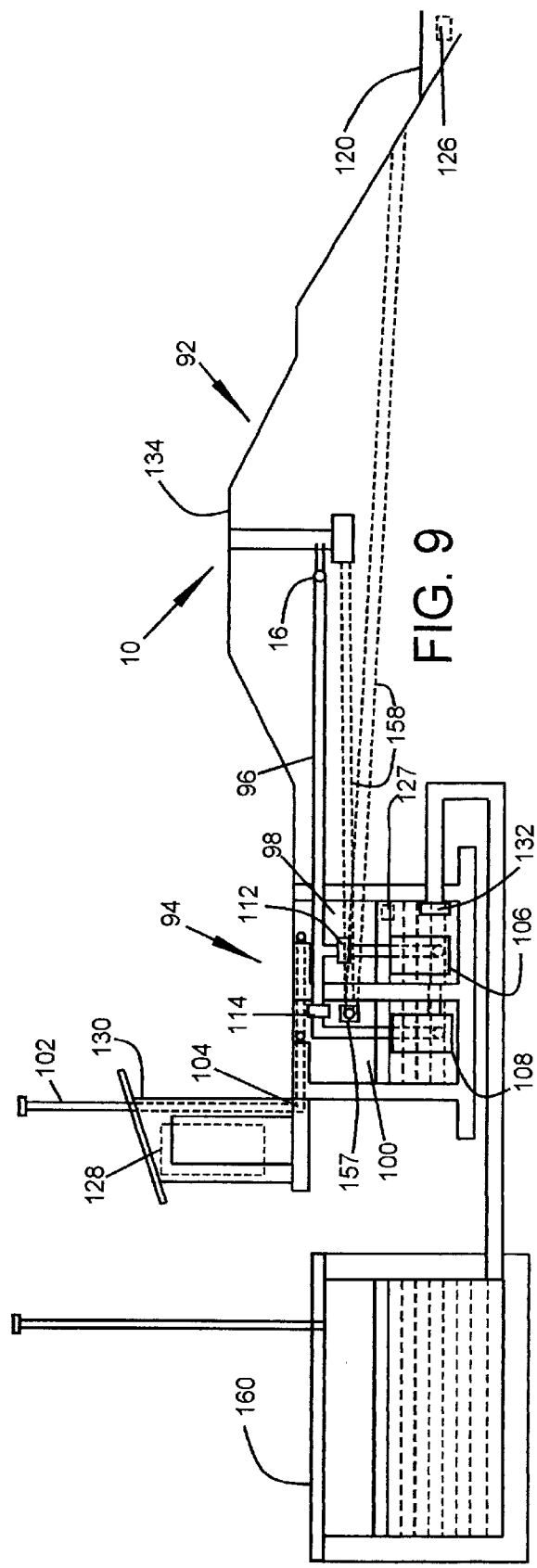

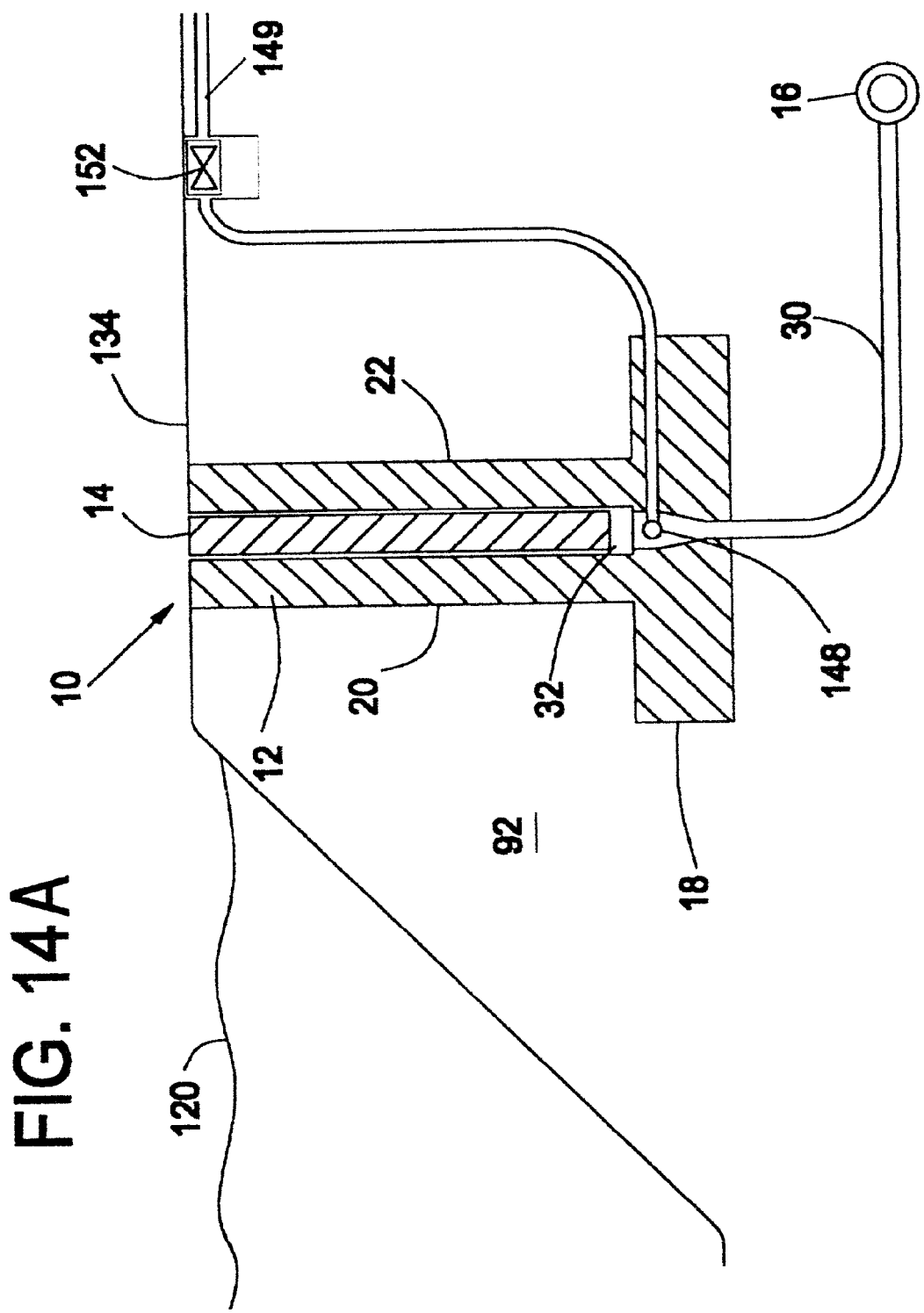

MOVABLE BARRIER WALL

CROSS REFERENCE TO RELATED APPLICATIONS

This invention claims the benefit of U.S. Provisional Applications No. 60/109,288, filed on Nov. 20, 1998 and No. 60/117,812, filed on Jan. 30, 1999.

STATEMENT REGARDING FEDERALLY SPONSORED RESEARCH OR DEVELOPMENT

Not Applicable

BACKGROUND OF THE INVENTION

1. Field of the Invention

This invention relates to a movable barrier wall and system that is selectively actuated. This invention is particularly useful as a water barrier system that may be actuated or elevated in anticipation of a flooding event. This wall system may be installed either along a river, and/or as part of a levee or dam, or to circumscribe a town or an individual piece of property.

2. Description of Related Art Including Information Disclosed Under 37 CFR 1.97 and 1.98

Movable wall systems are known in the prior art. Some examples of the known prior art are U.S. Pat. No. 5,460,462 that issued to Regan on Oct. 24, 1995 and U.S. Pat. No. 5,725,326 that issued to Van den Noort on Mar. 10, 1998. Each of the listed prior art patents discloses a movable wall and/or system that include a barrier wall that is floatable within a housing. However, each of the known prior art patents only teaches the passive extension of the barrier wall in response to or after the onset of a flooding condition. If a malfunction occurs the walls will not provide the protection desired. It has been determined that there is still a need for a movable barrier system that may be selectively actuated prior to a flooding event. It has been determined that there is yet a further need for a selectively activated movable barrier system that may be installed in a levee or dam, along a river, or other body of water that may flood. It has also been determined that there is yet a further need for a movable barrier system that may be installed along bends of a river. The present invention solves the above-identified needs as well as others that will become apparent in the discussion below.

BRIEF SUMMARY OF THE INVENTION

The present invention may be briefly described with respect to its objects. It is an object of this invention to provide and it does provide a movable barrier system and apparatus that is selectively raised by at least one pumping device and its associated control system.

It is another object of this invention to provide and it does provide a movable barrier system that may be selectively actuated by a control system in anticipation of a future flooding condition.

It is still another object of this invention to provide and it does provide a movable barrier system that includes a selectively operated actuating system while having at least one passive back up system.

It is still yet another object of this invention to provide and it does provide a movable barrier system that includes a selectively operated water supply system for elevation of its movable barrier portion and a back up passive intake system. The back up passive intake system includes a passive inlet water passage that is automatically closed when the movable barrier portion is at or near full elevation.

It is also another object of this invention to provide and it does provide a movable barrier system that is adaptable to be installed along a bend in a waterway.

It is still another and further object of this invention to provide and it does provide a movable barrier system that includes an elongated barrier member that includes individual barrier member modules that have an elongated vertical seal member installed between adjacent end surfaces thereof and the elongated vertical seal member allows relative movement between adjacent barrier member modules.

It is another object of the invention to mount the movable barrier system inside a river along the riverbank.

It is still another object of the invention to draw river water into the system before the flooding event underneath the set of movable barriers as the water level rises.

It is another object of the invention to provide and it does provide a manifold assembly of selectively sized and graduated pipes for providing uniform flow and pressure in conduits that distribute the intake water into the system to produce a condition whereby all of the barrier members raise and lower effectively simultaneously.

It is another object of this invention to provide and it does provide means for each individual movable barrier to react both independently and collectively as a unified flood protection system.

It is another object of the invention to provide and it does provide a series of water sealing elements, which are activated by the hydrostatic forces of the floodwaters.

It is still another object of this invention to provide and it does provide integral silt and contaminant restricting systems along all of the vertical and horizontal joints and clearances for both single and group barrier members.

It is another object of the invention to provide and it does provide means to independently select and actuate a finite length of the silt cleaning system.

It is also another object of the invention to provide and it does provide means for a guiding device inside a guide track for each barrier member during the floatation of the member.

It is another object of the invention to provide and it does provide a fitting to minimize the entry of debris into the system from the river inlet aperture structure.

It is another object of the invention to provide and it does provide a foundation that is designed to withstand the overtopping of the barrier system in almost any fully saturated soil conditions, either with or without leg piles.

It is also another object of this invention to provide and it does provide a series of impact resisting elements for adjacent barrier modules to redistribute and reduce the overall effect of debris impact loading on the system.

It is another object of the invention to provide and it does provide means to configure contiguous adjacent housing members along their bottom elevation to maintain level alignment with the uppermost surface to accommodate the changes in the depth and width of the river basin.

It is still another object of the invention to provide and it does provide means for inlet ports originating from a pressurized civil water supply.

It is yet still another object of the invention to provide and it does provide cast-in means in the concrete foundation for selective apertures, various seats for bumpers, flap gates, stops, bolting elements, guide tracks and stand-offs.

It is another object of this invention to utilize a manufacturing method to produce a uniform movable barrier in a one step process.

It is yet another object of this invention to provide and it does provide means to redirect any water leakage in the system back into the river during the flood event.

It is another object of the invention to provide and it does provide means to selectively seal off sections of the interior water passageways within the system for hydraulic or cleaning and maintenance purposes.

It is still another object of the invention to provide and it does provide impact resistant means along the length of each barrier member through a series of full length horizontal bumpers placed in both the concrete foundation and on the barrier wall itself.

One embodiment of the present invention may be briefly described as: a movable barrier floodwall system including: a) a housing assembly having a chamber formed by a base member, a first side panel member, a second side panel member, a left end member, and a right end member; b) a barrier member being vertically movable interior of said chamber, said barrier member having a selected density for allowing floatation thereof as and when a liquid is present interior of said chamber; c) at least one filling pump assembly having an inlet port and an outlet port, said inlet port being in fluidic communication with a supply of the liquid, said liquid having a selected liquid density greater than the selected density of the barrier member, said outlet port being in fluidic communication with said chamber by way of a distribution manifold assembly; and wherein each filling pump is selectively actuated by a control device or system for filling said chamber with said liquid for causing said barrier member to float within said chamber for extending a selected portion of said barrier member above an upper surface of said housing.

The present invention may also include features and/or objects such as a selectively actuated silt cleaning system for cleaning a lower portion of its' chamber; combined seals and bumpers; a passive back up chamber filling system that includes a combination intake and chamber venting flap valve; the mounting of the pumping system interior of sumps or vaults; a protective cap and vandal deterrent assembly that is carried by the barrier member; a protective cap assembly and vandal deterrent assembly that is pivotally carried by the barrier member to automatically rotate from a substantially horizontal attitude when the barrier member is retracted to a substantially vertical attitude as the barrier is raised for acting as a barrier extension; a pump control system that may be manually, automatically or remotely actuated for testing, and/or cleaning; a barrier member that is light weight and made from a plurality of individual flotation elements or rods that are combined with non metallic and oriented shear webs or layers and non-metallic and oriented exterior skins for structural strength; and a passive backup floatation means. These features and others that will be discussed below may be used individually or selectively combined to suit a particular application.

In addition to the above summary, the following disclosure is intended to be detailed to insure adequacy and aid in the understanding of the invention. However, this disclosure, showing particular embodiments of the invention, is not intended to describe each new inventive concept that may arise. These specific embodiments have been chosen to show at least one preferred or best mode of the present invention. These specific embodiments, as shown in the accompanying drawings, may also include diagrammatic symbols for the purpose of illustration and understanding.

BRIEF DESCRIPTION OF THE SEVERAL VIEWS OF DRAWINGS

FIG. 5 represents an isolated plan view, in an enlarged scale, of a vertical sealing gasket between two adjacent barrier member modules that are in close proximity to each other.

FIG. 6 represents an isolated plan view of the vertical-sealing gasket between two adjacent barrier member modules that are in a slightly spaced relationship. This view is in the same scale as FIG. 5 and taken in the same direction.

FIG. 6A represents an isolated plan view of a terminal end of the barrier member.

FIG. 7 represents an isolated plan view of a sealing gasket between two adjacent barrier members in a slightly misaligned configuration or for use as a chord in a curved configuration. This view is taken in the same direction as FIG. 5.

FIG. 7A represents an isolated plan view of the terminal ends of two adjacent barrier members. This view shows a gap-sealing member mounted at end surfaces of the adjacent barrier members in both its passive and active modes.

FIG. 8 represents a sectional view of one typical installation of the present invention. This view being partly schematic and showing the present invention pumping water from an adjacent body of water such as a river or a stream.

FIG. 8A represents a plan view of a distribution manifold assembly of the present invention. This view being partly schematic and showing the set of conduits emanating from the sumps to evenly distribute water throughout the movable barrier assemblies.

FIG. 8B represents a plan view of a detail of the distribution manifold assembly of the present invention. This view being partly schematic shows selectively sized and graduated conduits.

FIG. 9 represents a sectional view of an alternate installation of the present invention. This view being partly schematic and showing the present invention pumping water from a clean source of water such as a tank, pool or the like.

Figure 11:
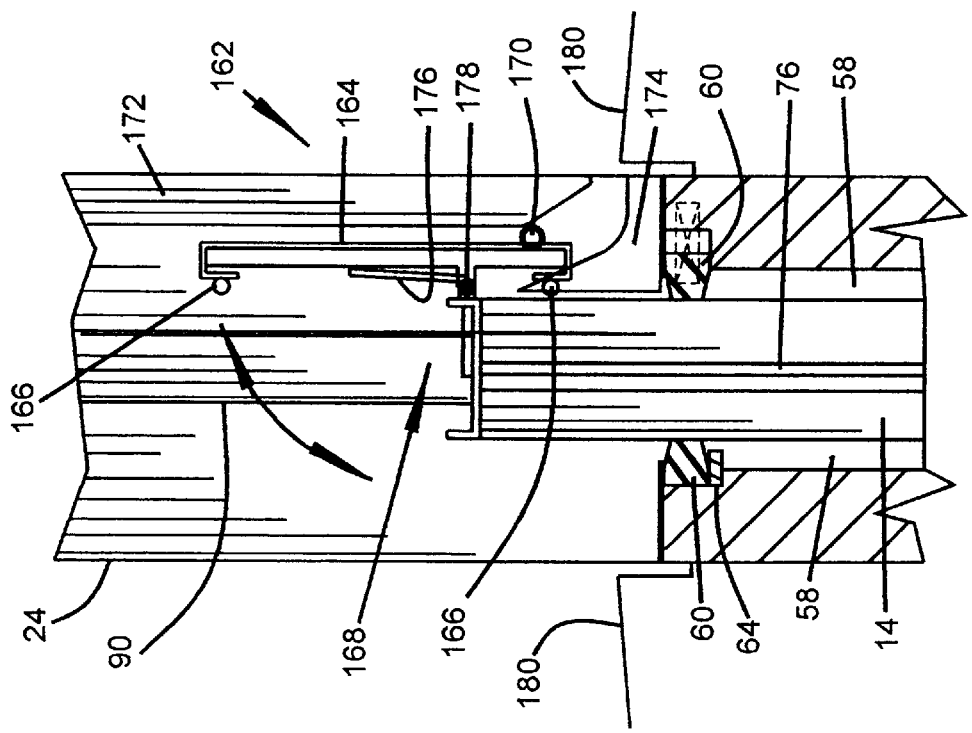

FIG. 11 represents an enlarged section of a top portion of a barrier member during its elevation. This view shows a protection cap assembly that is pivotally mounted to the barrier member. This view showing the protective cap assembly rotated to a substantially vertical position for acting as a barrier extension.

Figure 12:
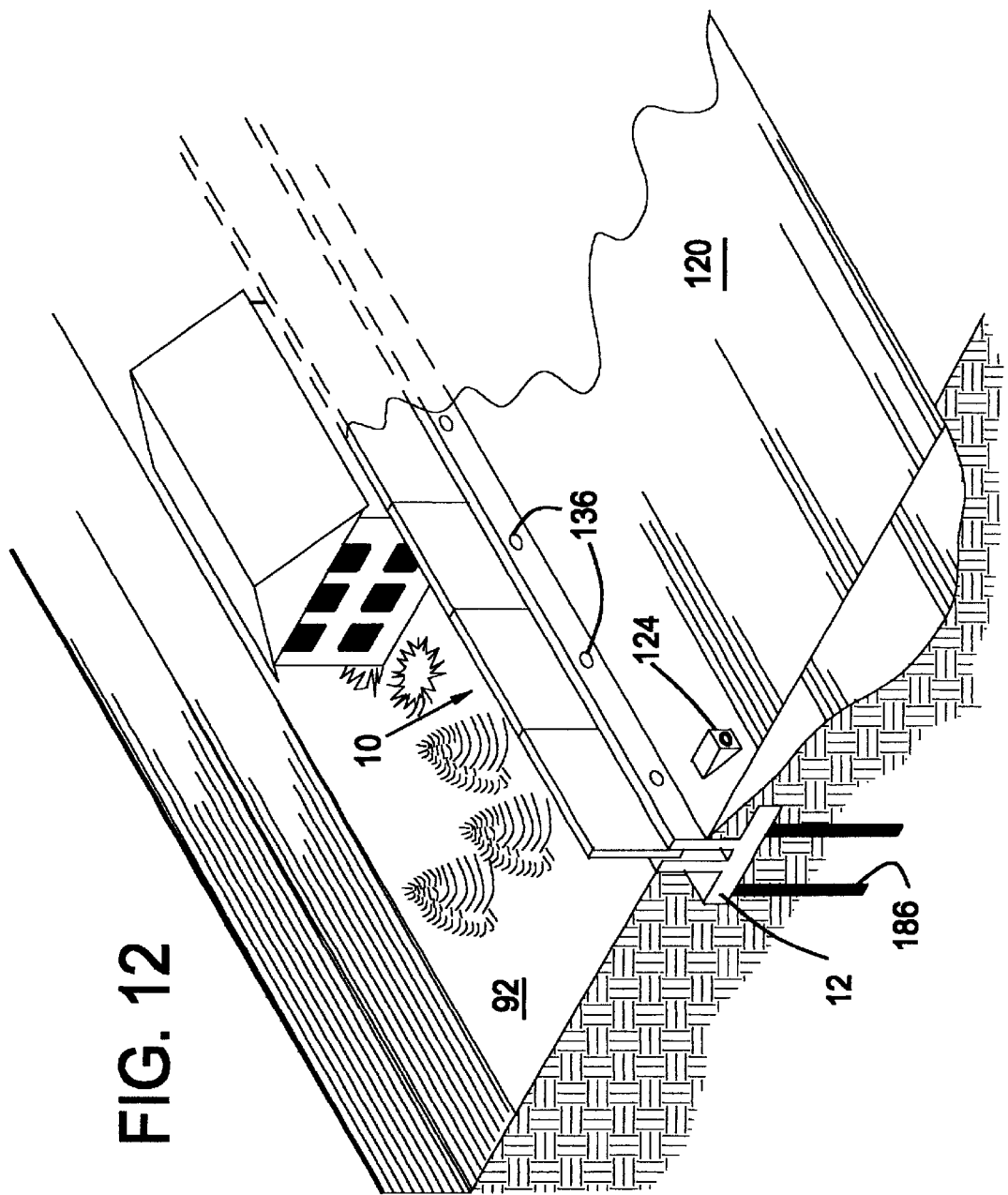

FIG. 12 represents an aerial view of another alternate installation of the present invention. This view being partly schematic showing the present invention mounted inside the river along the riverbank.

Figure 13:
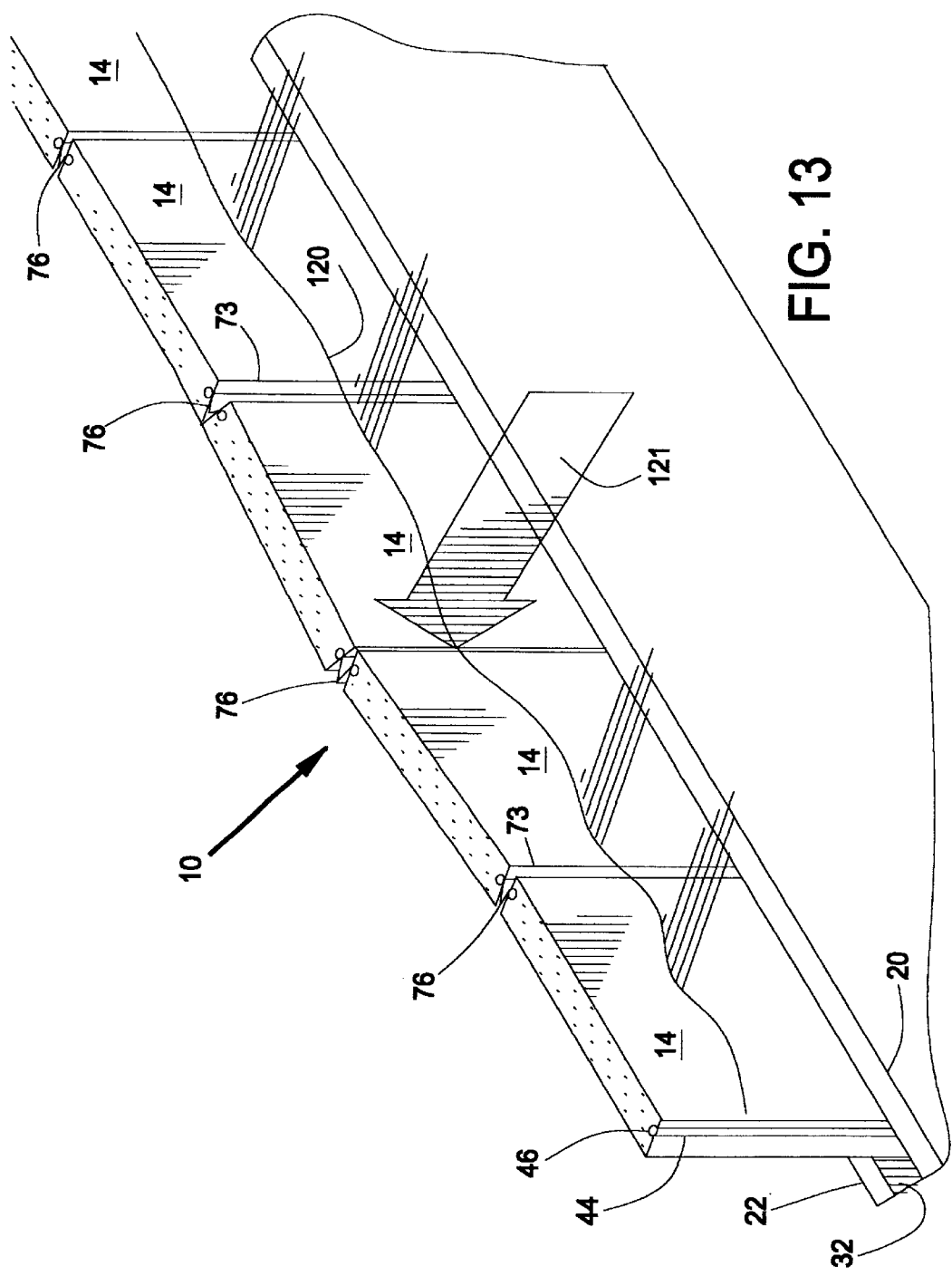

FIG. 13 represents a perspective view of one typical installation of the present invention. This view being slightly schematic and showing the present invention being impacted by a debris element in the body of water.

Figure 14:
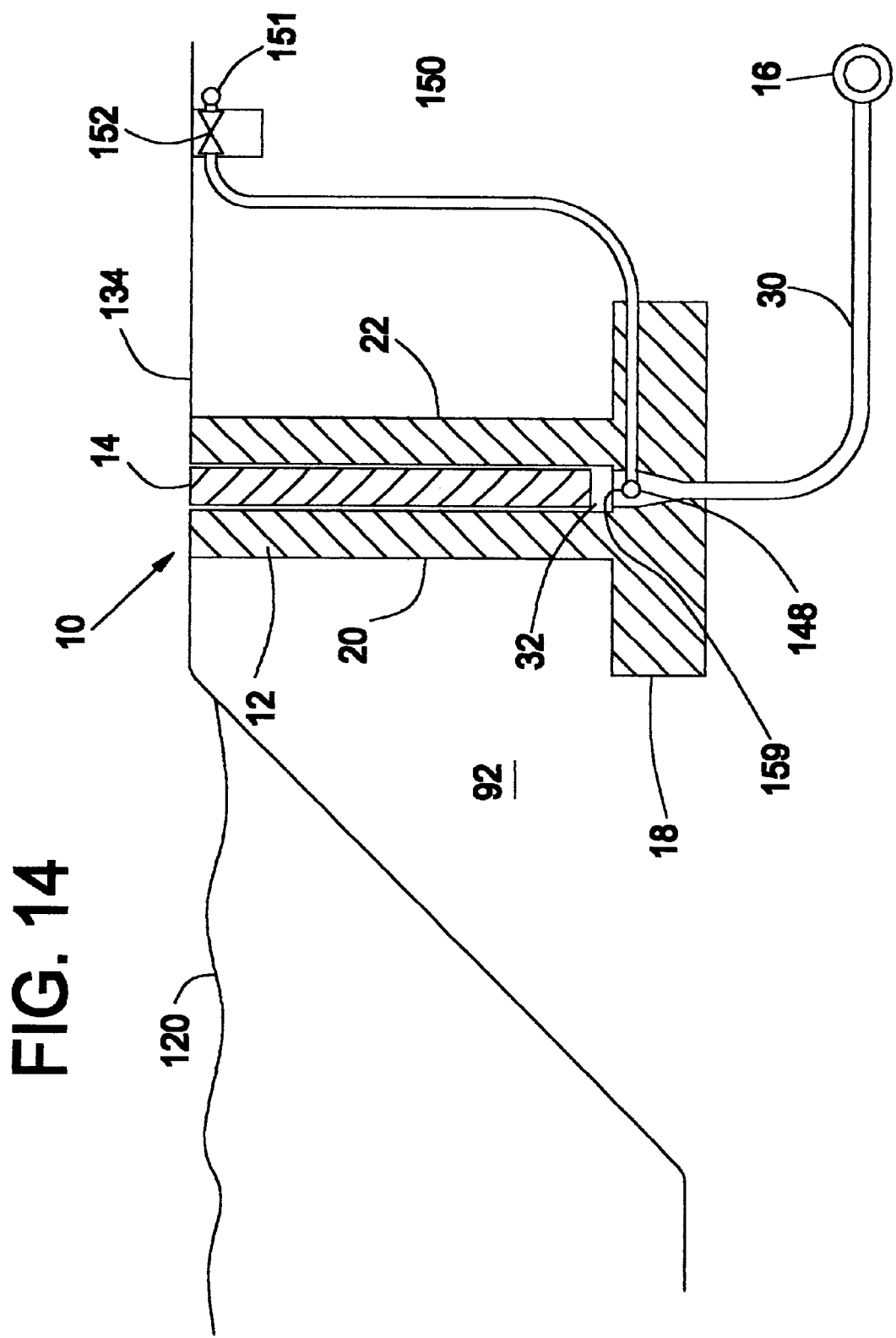

FIG. 14 represents a sectional view of an alternate installation of the present invention. This view being partly schematic and showing the present invention pumping water to flush silt and contaminants out of the system.

FIG. 14A represents a sectional view of an alternate installation of the present invention. This view being partly schematic and showing the present invention utilizing pressurized water from a civil source to raise the barrier members.

Figure 15:
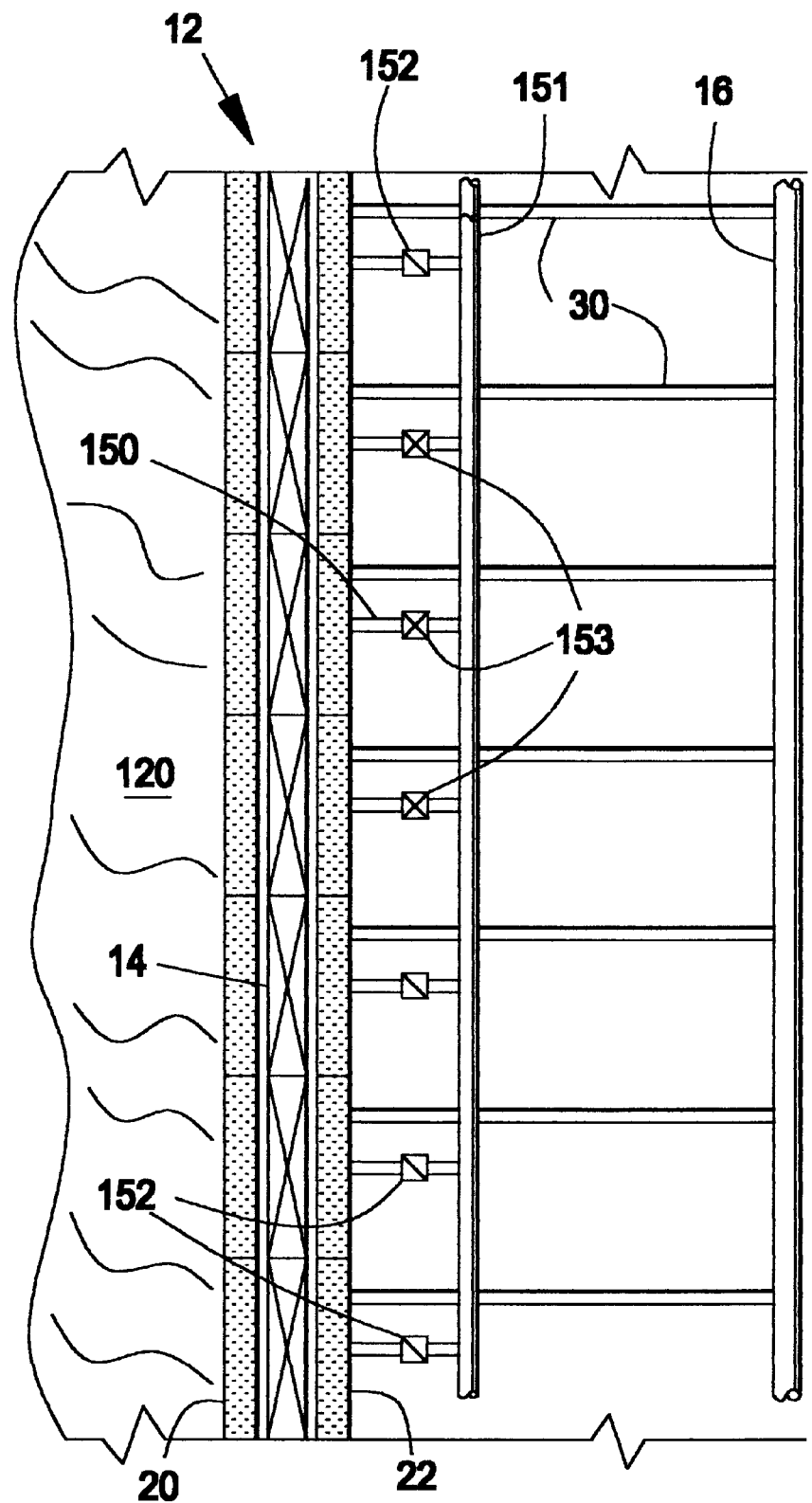

FIG. 15 represents a plan view of an alternate installation of the present invention. This view being partly schematic and showing the present invention with the main distribution manifold assembly and multiple silt control valves.

Figure 16:
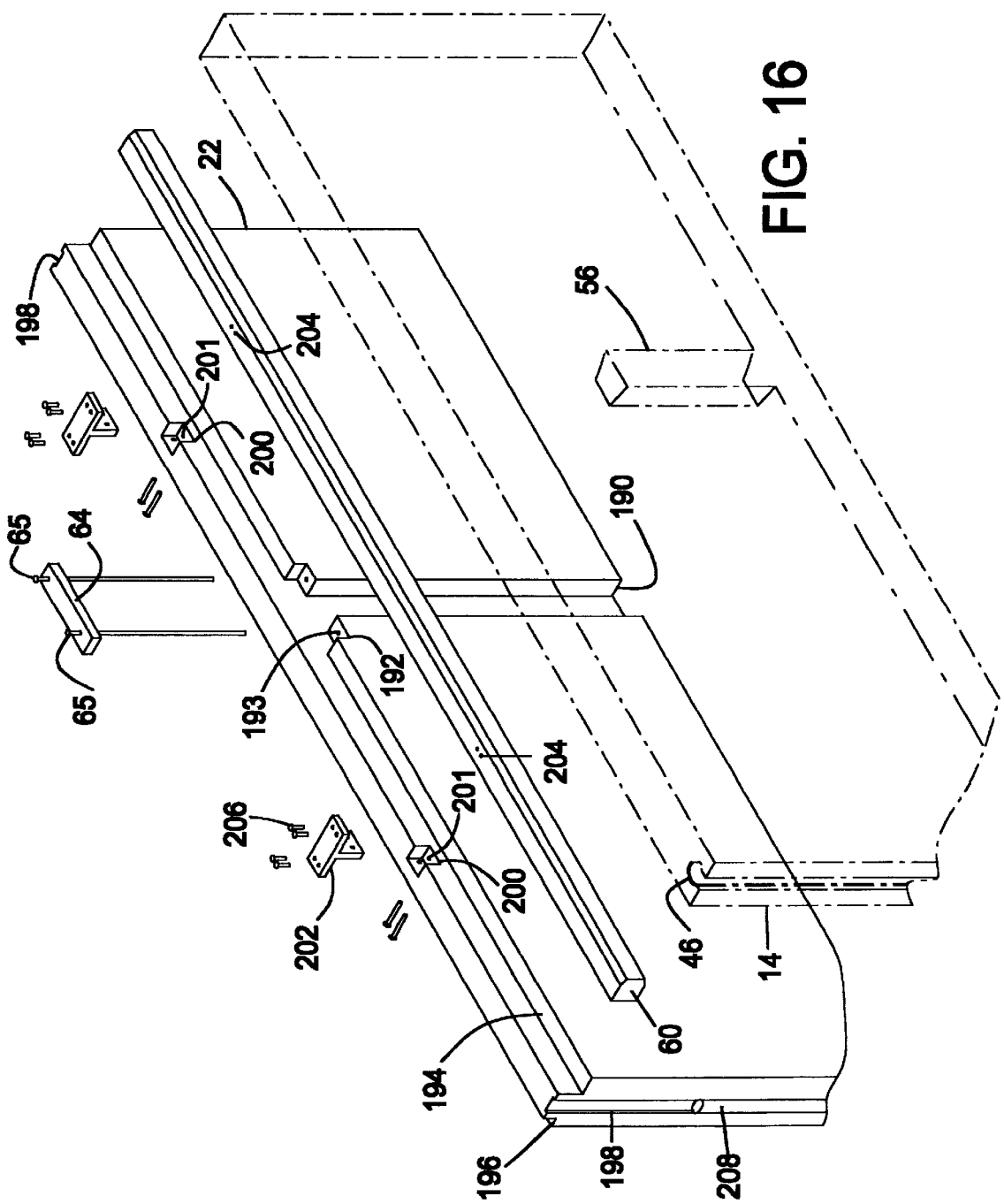

FIG. 16 represents a perspective view of an enlarged section of the second side panel of the housing assembly. This view being partly schematic and showing the present invention with various indents, detents, holes and guide tracks preset in the side panel.

Figure 17:
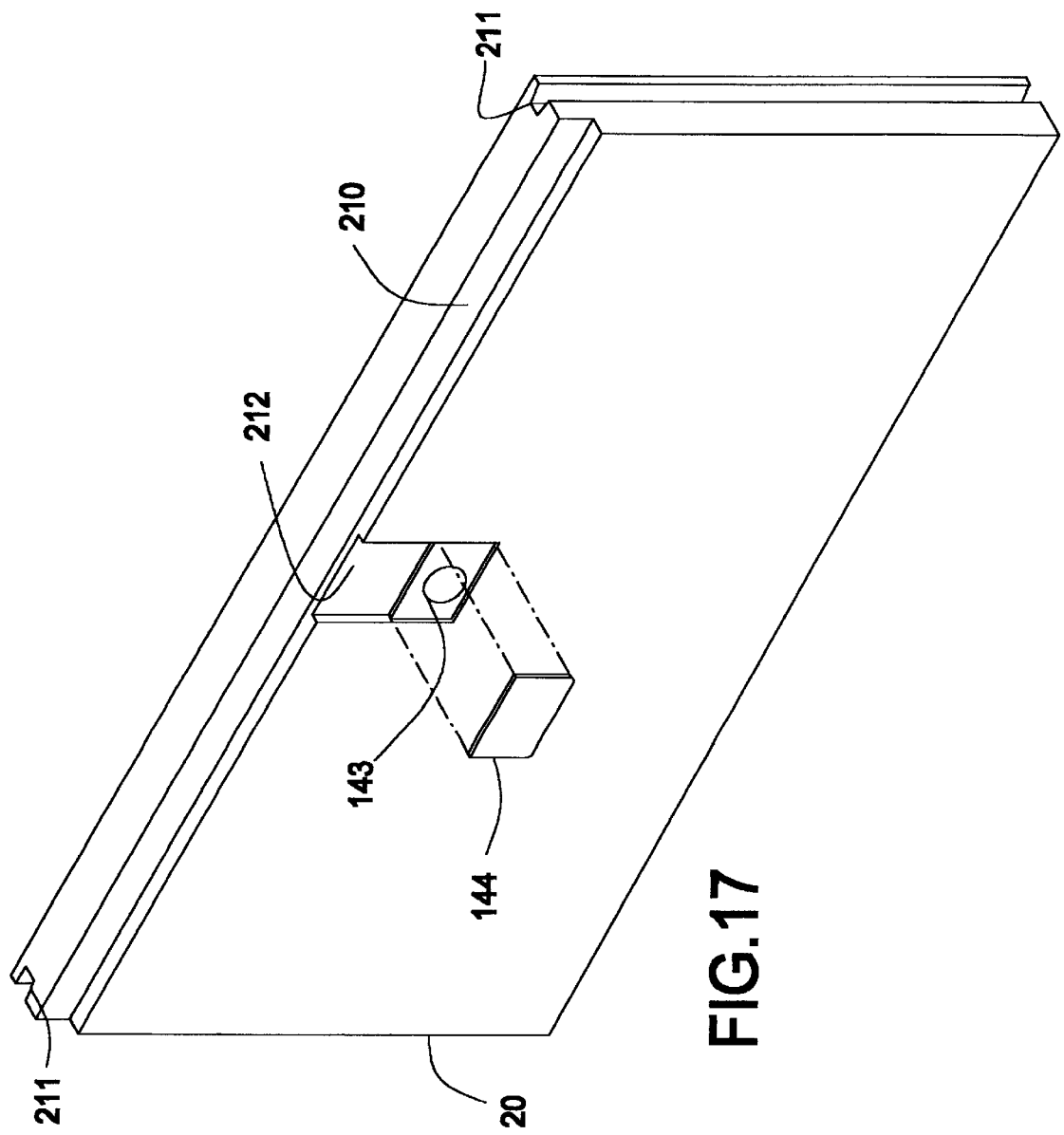

FIG. 17 represents a perspective view of an enlarged section of the first side panel of the housing assembly. This view being partly schematic and showing the present invention with various indents, detents, holes and guide tracks preset in the side panel.

Figure 18:
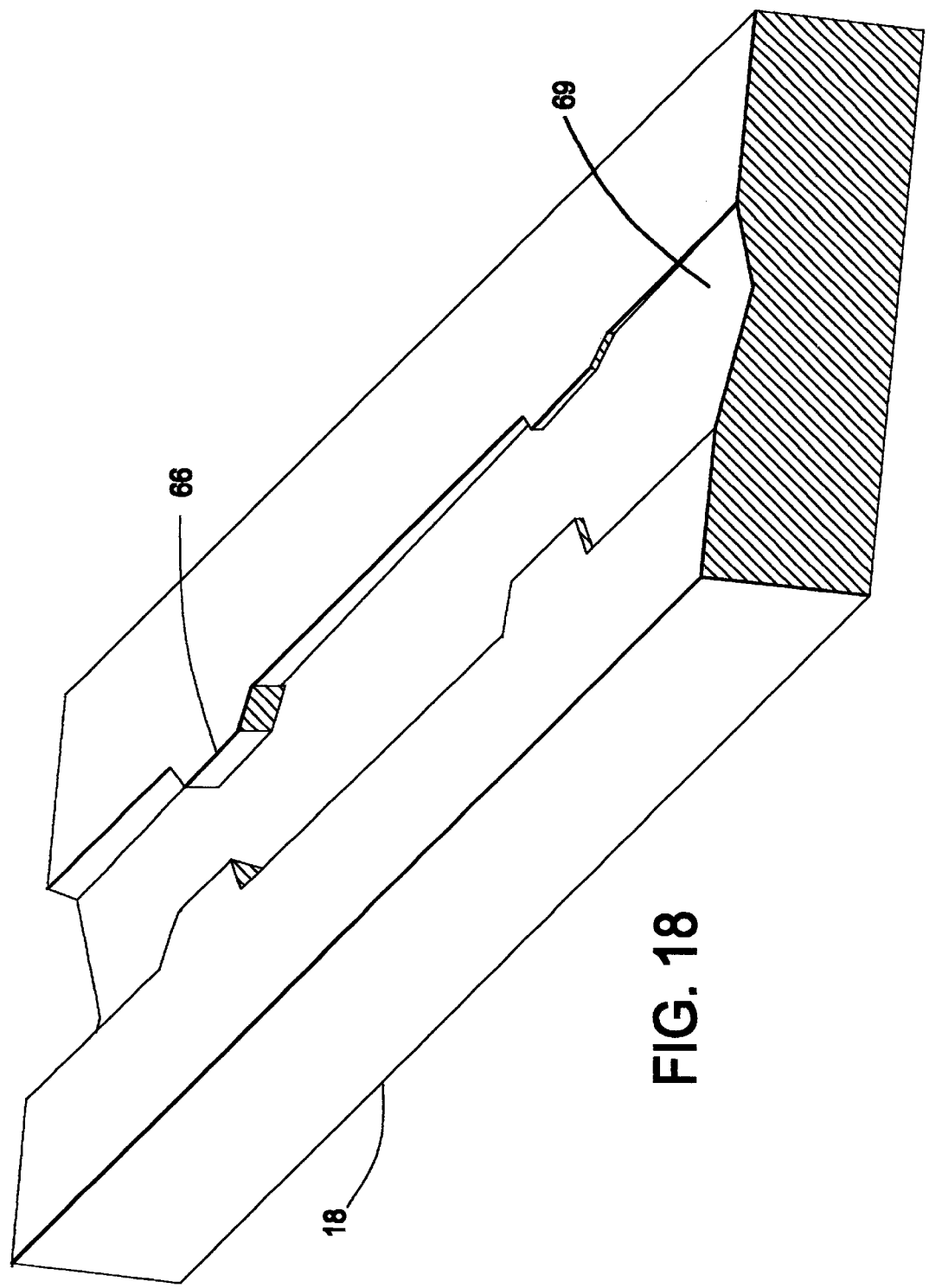

FIG. 18 represents a perspective view of an enlarged section of the base member of the housing assembly. This view being partly schematic and showing the present invention with various indents and stand-offs preset in the base member.

Figure 19:
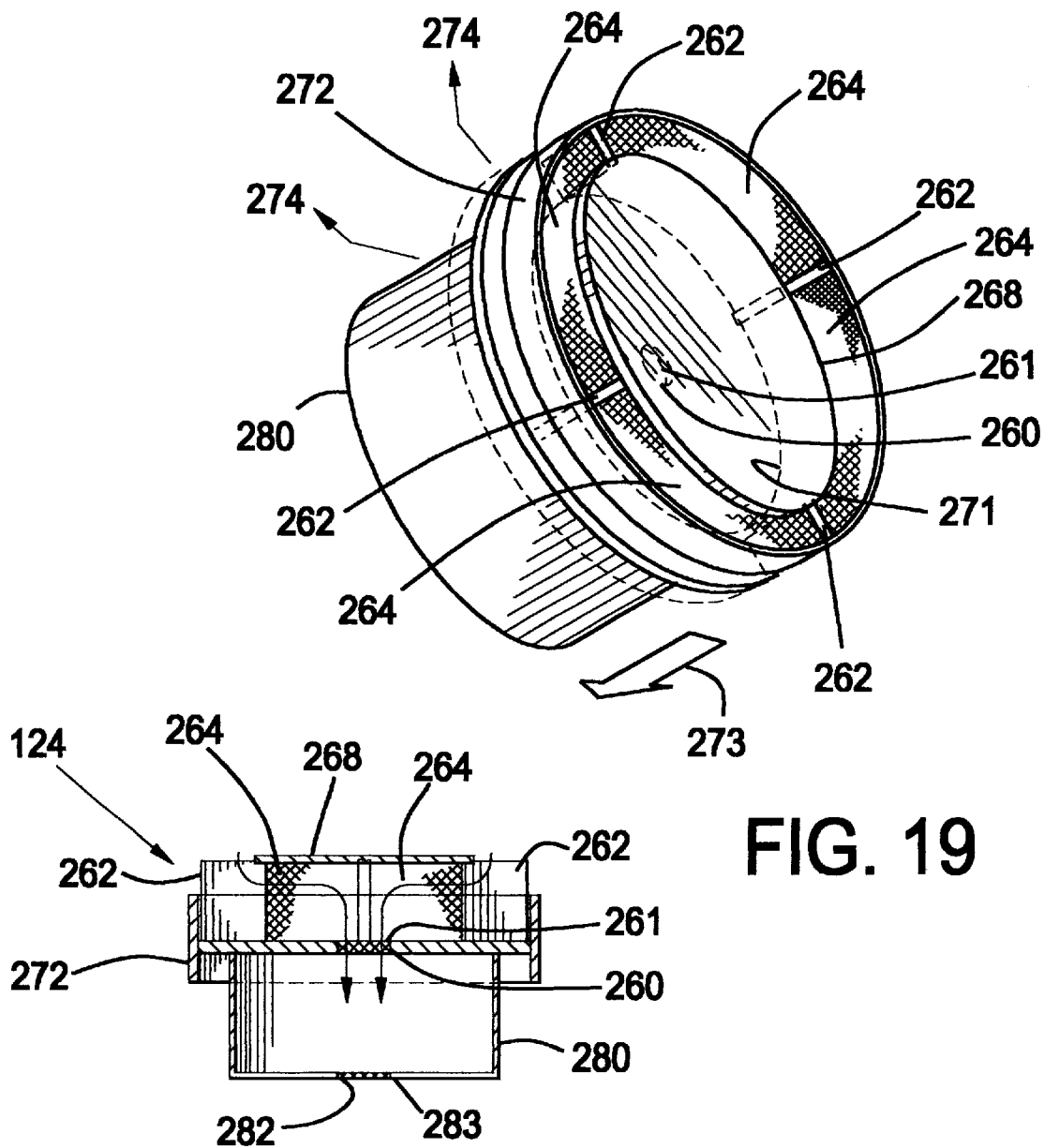

FIG. 19 represents an enlarged isolated perspective view of the intake/discharge fitting mounted inside the body of water.

In the following description and in the appended claims, various details are identified by specific names for convenience. These names are intended to be generic in their application while differentiating between the various details. The corresponding reference numbers refer to like members throughout the several figures of the drawing. The drawings and disclosure of provisional application No. 60/109,288 and 60/117,812 are incorporated into this application by reference.

The drawings accompanying and forming a part of this specification disclose details of construction for the sole purpose of explanation. It is to be understood that structural details may be modified without departing from the concept and principles of the invention as claimed. This invention may be incorporated into other structural forms than shown.

DETAILED DESCRIPTION OF THE INVENTION

Referring to the drawings and in particular to FIGS. 1 through 5, the movable barrier assembly of the present invention is generally identified as 10. The movable barrier assembly 10 includes a housing assembly 12; an elongated barrier member 14; and a distribution manifold assembly 16. The housing assembly 12 includes a base member 18, a first side panel 20, a second side panel 22, a left end member 24, and a right end member 26. The housing assembly 12 must be of a watertight construction and be made of a material, such a poured concrete and the like, for resisting floatation in wet or saturated soils. The base member 18 must have a sufficient cross sectional area for supporting anticipated static and dynamic loads of the movable barrier assembly 10. The housing assembly 12 may be made of individual steel reinforced components that are assembled and sealed in a conventional manner or as molded reinforced and pre-stressed housing modules having a generally U-shaped configuration and a predetermined length. The housing modules are molded to be aligned, abutted, and sealed by conventional means to span a given length between the right end member 26 and the left end member 24. In some applications it may be necessary to install the housing on and over pilings, not shown, for providing stability to the movable barrier assembly 10. The housing assembly 12 preferably includes a plurality of through apertures 28 for placement of a plurality of conduits 30 therethrough that connect the interior or chamber 32 of the housing assembly 12 with the distribution manifold 16. The apertures 28 must include a suitable sealing arrangement for maintaining the desired watertight characteristics of the housing 12. The distribution manifold 16 and its associated conduits 30 must be of a sufficient size for carrying the anticipated hydraulic pressures and flows. The hydraulic pressures and flows are dependent on the volume of interior of the housing or chamber 32, the weight of the barrier member, and the distance that the barrier member 14 will be elevated to full displacement.

The barrier member 14 is constructed of a material that will float when immersed in water. It is preferred that the total density of the barrier member 14, including any attachments, be within the range of 240.3 and 480.6 Kgs. per cubic meter (15 and 30 pounds per cubic foot). One non-limiting example for the construction for a barrier member 14 is a core 34 of a closed cell foam and a protective covering material 36 that completely encases the core 34 and protects it from abrasion as well as providing structural strength. The core 34 also resists absorbing water if punctured.

The core 34 may be made as a unitary piece of closed cell foam, however, it has been found that constructing the barrier member 14 of a plurality of elongated closed cell foam rectangular rods or buns 38 that are abutted to each another. The use of plurality rods or buns 38 will provide a substantially flat surface 40 while providing a desired quality control of a predetermined density in the neighborhood of 320.4 Kgs. per cubic meter (20 pounds per cubic foot). A first step in assembling the barrier member 14 includes the step of completely wrapping each rod 38 with at least one shear layer 42 of an oriented E-glass reinforcement or mesh such as EQX-5300. A series of combined shear layers 42 wrapped around each rod 38 create longitudinal structural webs that produce vertical impact resisting elements for each barrier member 14. Additionally layers of the E-glass horizontal reinforcement mesh strips 49 oriented across each barrier member 14 at the grade level when the barrier member 14 is fully extended are made to align with bumpers 60 to produce horizontal impact resistance along the largest shear moment in the system during hydraulic loading. When elongated barrier member 14 is comprised of individual sub assemblies or barrier member modules 15, the second step is to form an undercut 44, seen most clearly in FIG. 5, into one side of a rod 38 that will be on an end that is expected to be exposed and facing towards an adjacent individual barrier member module 15 of the elongated barrier member 14. The undercut slot 44 is reinforced with an elongated insert 46 that has a generally keyhole cross-section. An optional third step includes attaching of lifting lugs 48 at and into predetermined places along a top edge of the barrier member 14. In some installations it may be preferable that the lifting lugs 48 be removably attached for selective removal or reattachment at a later time. Preferably an elongated V-shaped filler rod 50 is placed in any V-shaped grooves along surface 40. The components of the barrier member 14 are placed on flat table that is covered with an oriented and layered E-glass material similar to the shear layer. Subsequently, the E-glass material is wrapped completely around the opposite side 52 of the barrier member 14 to form a skin or covering layer 36 after inserting of additional filler rods 50 along the opposite side 52. The barrier member 14 is finally impregnated or infused with a vinyl ester-epoxy resin under vacuum and allowed to cure. Additional layers of E-glass material may be added to the barrier members 14 at predetermined positions 53 for adding strength to barrier members 14. The endmost rectangular rods 38 of barrier member 14 may be shorter in length than the inner rectangular rods 38, as may be seen in FIG. 1 to form a passageway 54. It is also preferred that the barrier member 14 have at least one elongated stop member 56 that is removably secured thereto or alternatively, molded therein and thereon.

Figure 3:
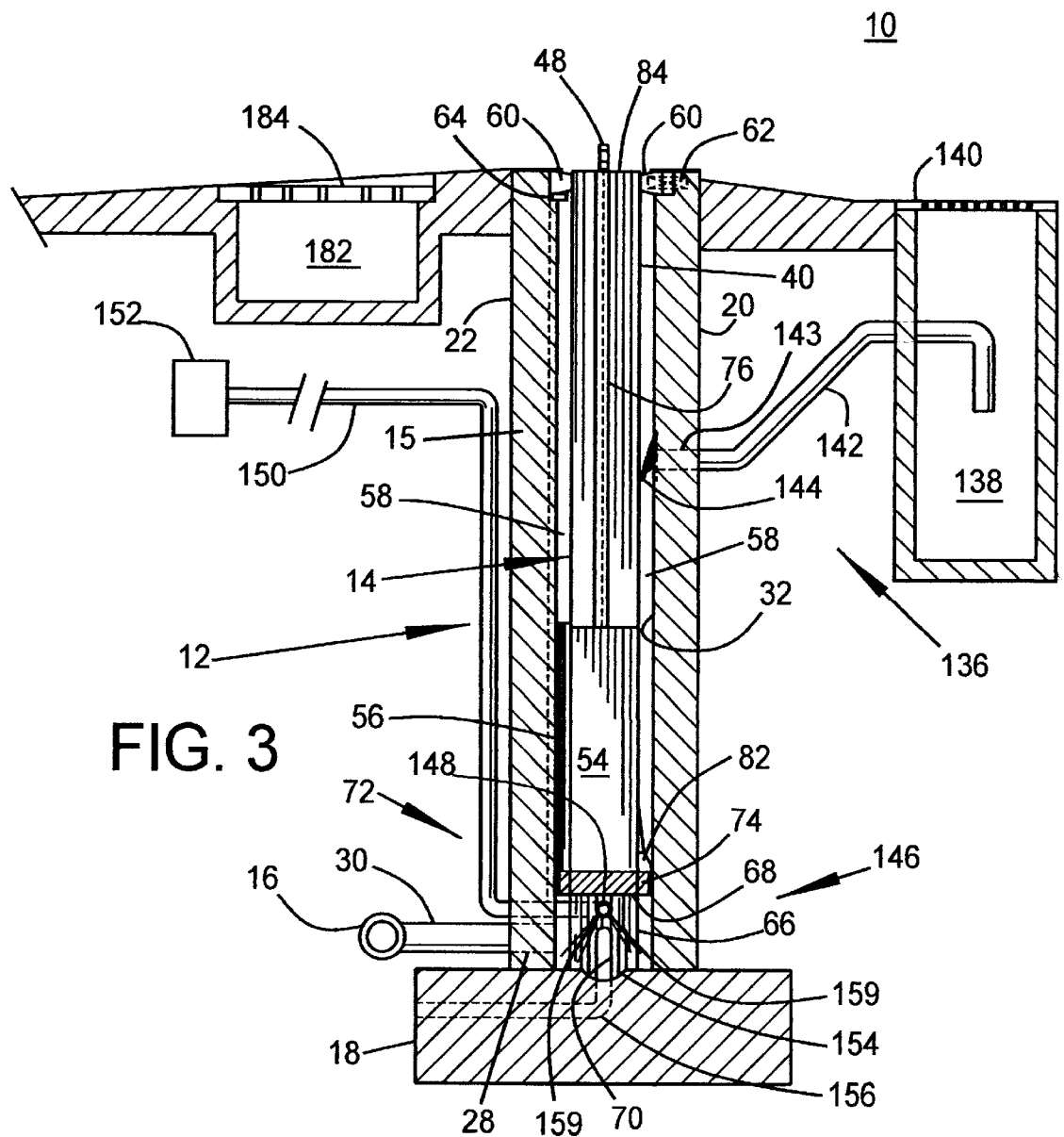
FIG. 3 represents a sectional view in an enlarged scale of the movable barrier system in a retracted condition, this view being taken along line 3—3 of FIG. 2.
Figure 4:
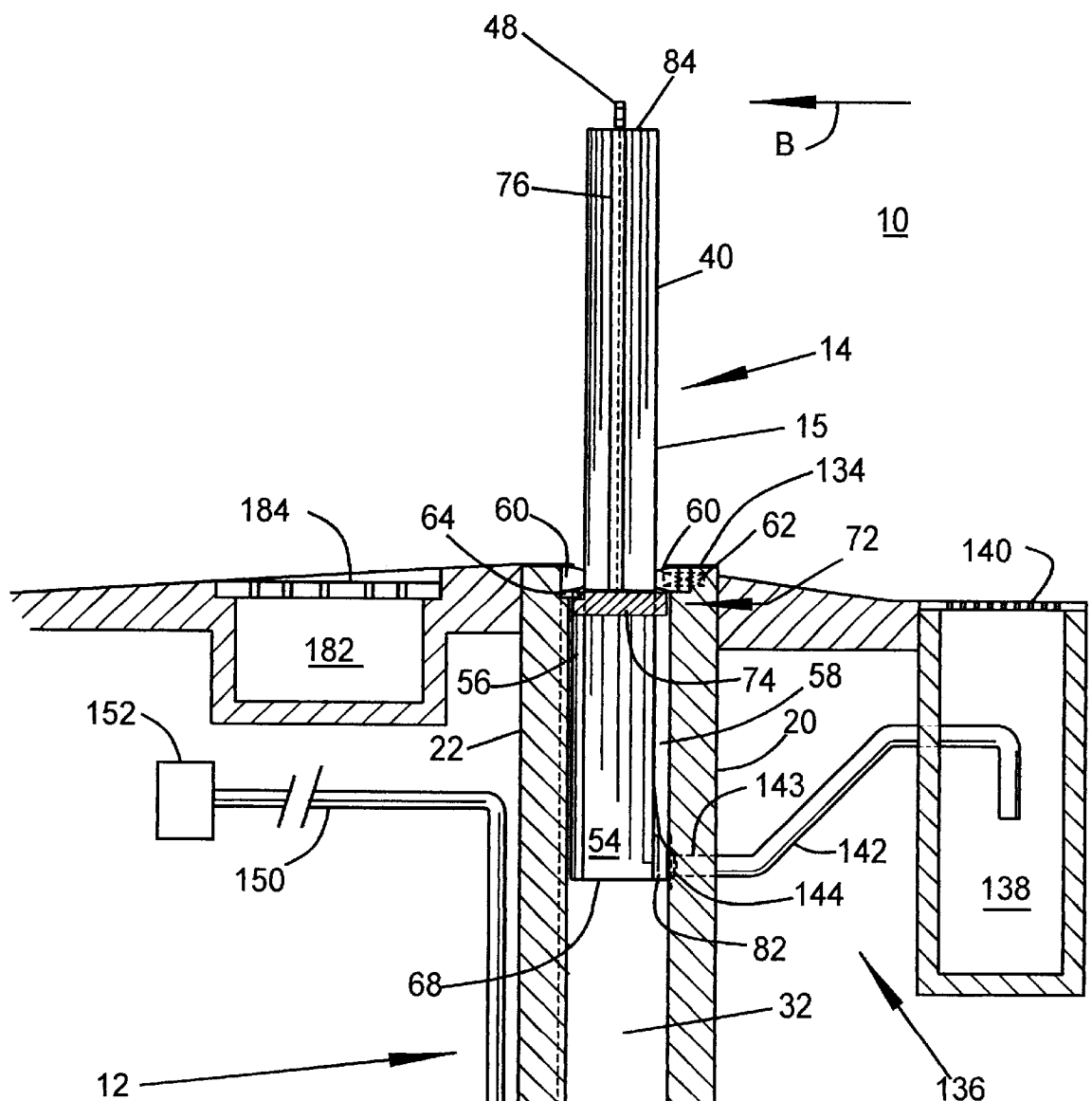
FIG. 4 represents a sectional view of the movable barrier system in an extended or elevated condition, this view being taken in the same direction and scale as FIG. 3.

The barrier member 14 is sized to fit into the chamber 32 with a predetermined and selected clearance 58, more clearly seen in FIGS. 3 and 4. This clearance 58 should provide an ample allowance for the floatation of the barrier member 14 therein while minimizing the volume of water required for full floatation thereof. One non-limiting example of a predetermined clearance 58 is 7.62 cm. (3 in.) on each side. In order to minimize the entrance of contaminants into the chamber 32, elongated elastomer bumpers 60 are provided at or near the top edge of side panels 20 and 22.

These bumpers 60 provide a primary sealing means. It is preferred that one of the bumpers 60 include a non-corrosive biasing device 62 such as a stainless steel compression spring, urethane compression spring and the like. This biasing device 62 maintains contact of the biased bumper 60 with the flat surface 40 of the barrier member 14 if and when compression occurs at the opposing stationary bumper 60 due to hydraulic loading. This moving assembly between bumper 60 and the flat surface 40 produces a silt restricting system for minimizing the entry of contaminants into chamber 32. This biasing means 62 will also maintain contact with the flat surface 40 should any wear occur at the opposing stationary bumper 60. One non-limiting example of an elastomer material for the bumper is a neoprene rubber. The elongated stop member 56 is position on the barrier member 14 and projects therefrom. This stop member 56 abuts a projecting non-corrosive metal bar 64 that is selectively positioned at or near the top of the second side panel or wall 22 when and as elevation of the barrier member 14 occurs, as seen in FIG. 4. It is preferred that this metal bar 64 and each of the bumpers 60 be removably fastened to the panel 22 for allowing the barrier modules to be installed and subsequently removed for inspection, service or routine maintenance of the system 10.

Figure 2:
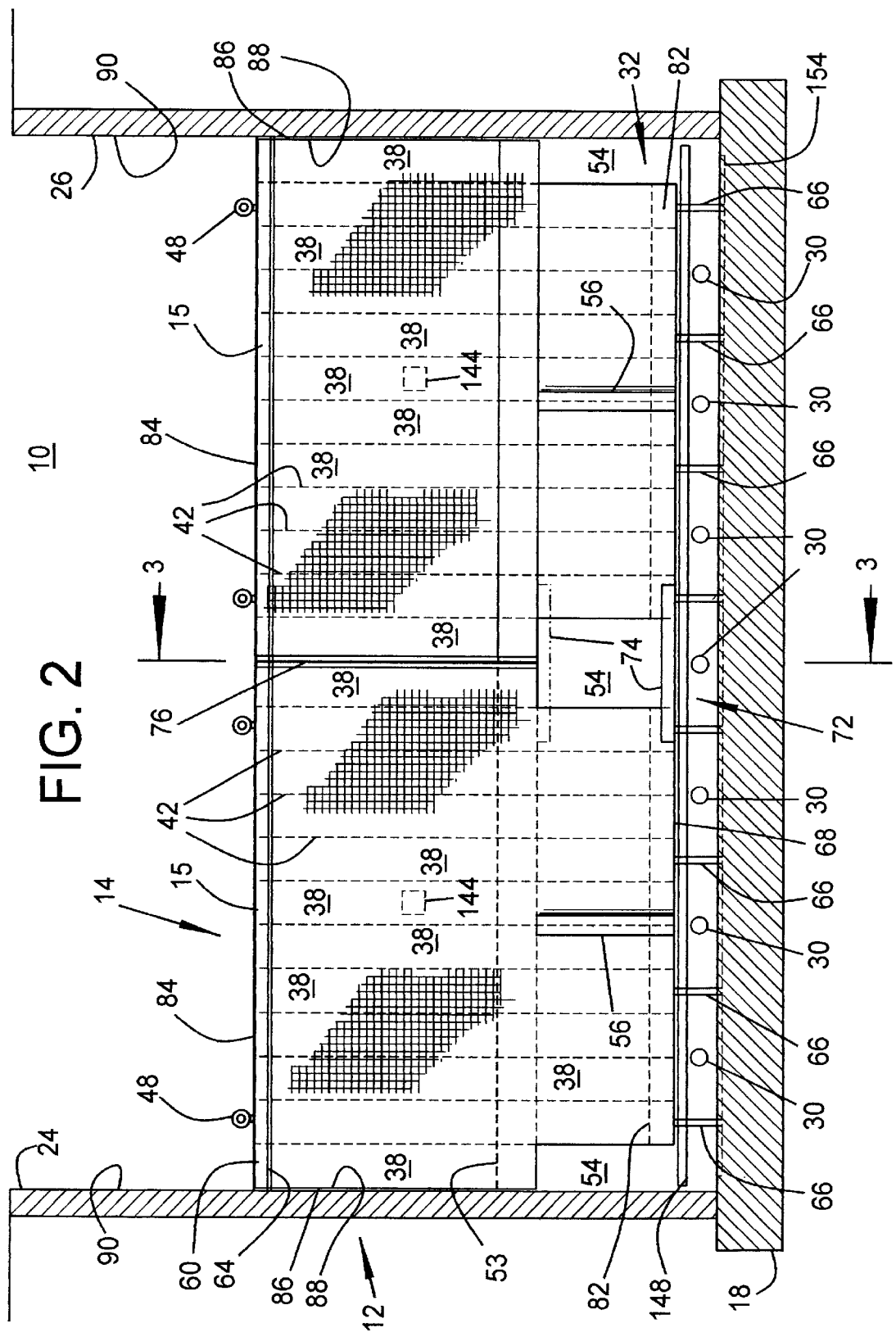
FIG. 2 represents a front elevation of the movable barrier system of FIG. 1, this view being partly in section and being taken along line 2—2 of FIG. 1.
Figure 2A:
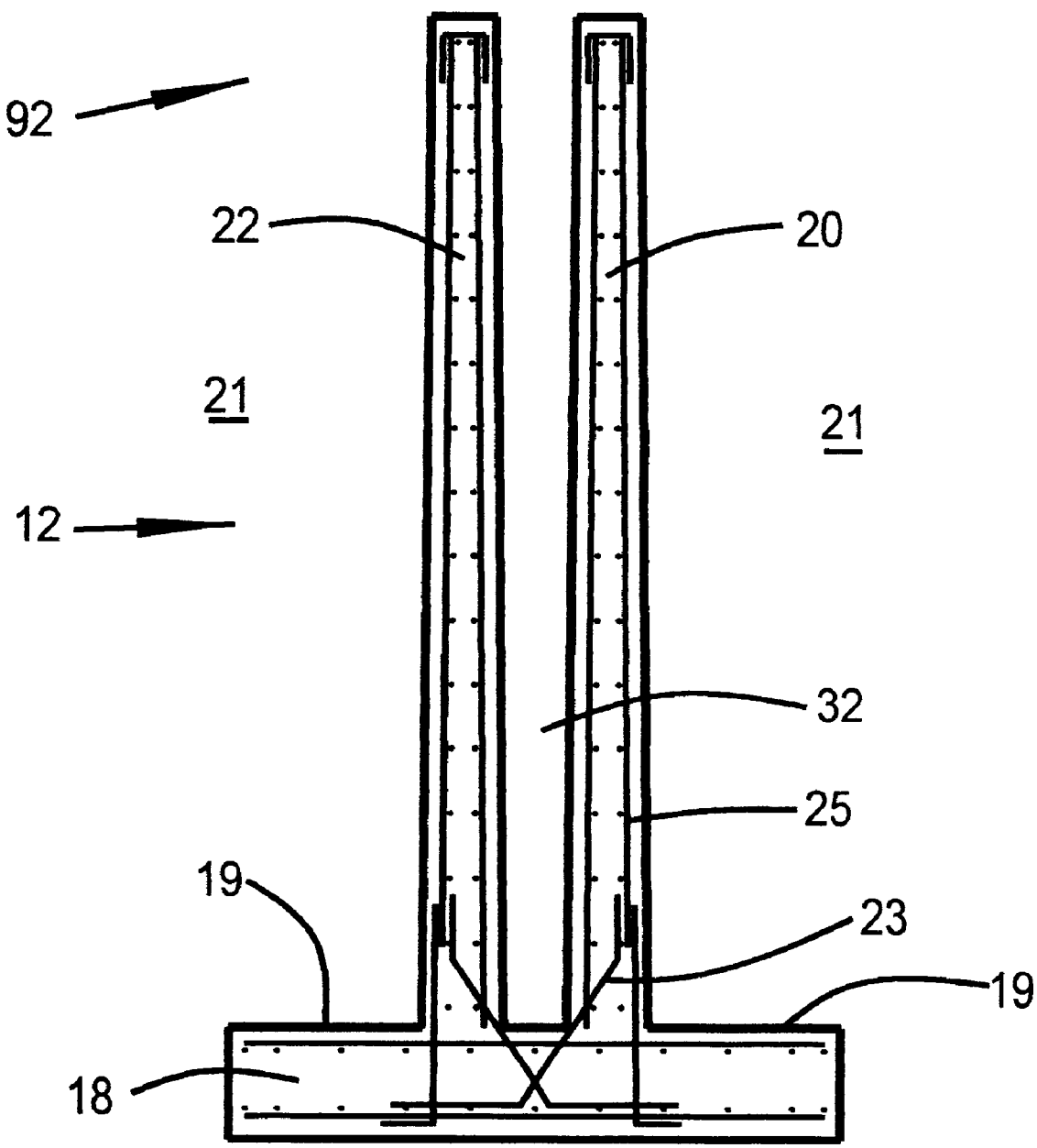
FIG. 2A represents a sectional view of the under ground mounting assembly of FIG. 3.

Referring to FIG. 2A, housing assembly 12 is mounted sufficiently in the levee or dam 92 to stabilize the housing assembly 12 as the barrier member 14 is fully extended during hydraulic loading by utilizing selected extended end portions 19 of the base member 18 from the exterior surface of side panel members 20 and 22 in which soil 21 is placed over end portions 19 to stabilize the barrier member 14 inside the interior chamber 32 from overtopping the movable barrier assembly 10. In addition both cross laced reinforcing metal reebar elements 23 and longitudinal reinforcing metal reebar elements 25 help to stabilize the housing assembly 12 from overtopping as the barrier member 14 is fully extended in the housing assembly 12 during hydraulic loading.

Figure 4A:
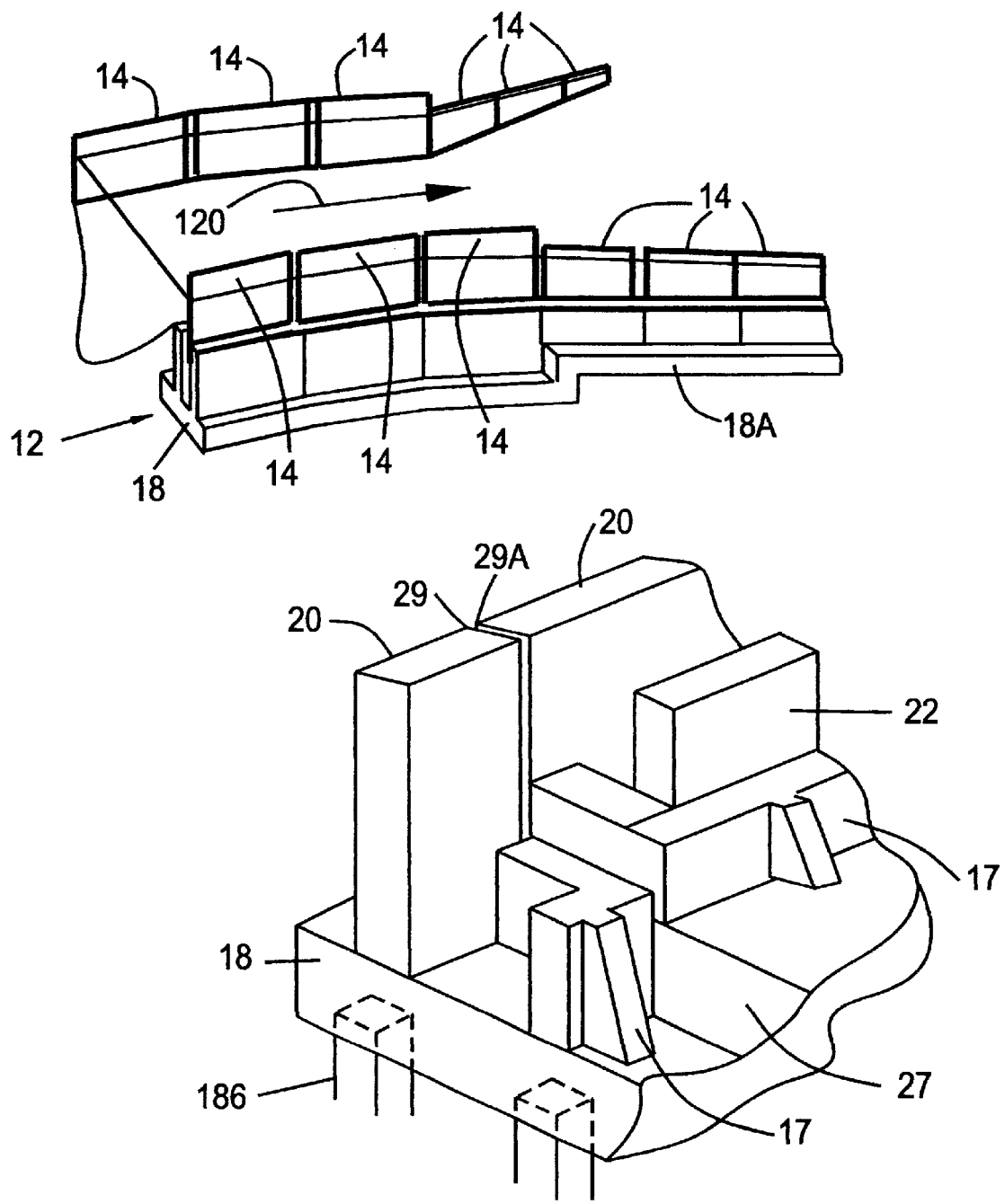
FIG. 4A represents a perspective view of a series of housing members that vary in elevation according to the river's width or slope.

Referring to FIG. 4A, multiple housing assemblies 12 have been designed to accommodate differing elevations of the body of water 120 to maintain a level alignment with the uppermost surface of the body of water 120 as the body of water 120 widens or slopes. The multiple movable barrier assemblies 10 must accommodate these changes to perform the useful function of flood control throughout the body of water 120.

In order to maintain a contiguous housing assembly 12 throughout the varying elevations of the body of water 120 an on-site construction method of utilizing a temporary bulkhead 27 structure to either lift or lower pre-cast bases 17 and cast in place base members 18 and side panels 20 and 22 is combined to produce a desired final elevation of the fully extended barrier member 14.

This construction method utilizes the temporary bulkhead 27 to be placed under pre-cast base units 17 with cast-in-place side panels 20 and 22 for the varying elevations required. After setting of the temporary bulkheads 27 in place either the upper or lower base member 18 can be poured in place. Then the pre-cast base units 17 and the side panels 20 and 22 are added. After these units are cured, Grout 29 and a sealing joint 29A is then added to the pre-cast base 17 and to the cast in place side panels 20 and 22. After the concrete base 18 has sufficiently cured the temporary bulkheads 27 are removed, ready to be reused elsewhere. This system can use pilings 186 where needed for extra support.

Referring again to FIGS. 1 through 5, it is preferred that a plurality of standoffs 66 be positioned and spaced within the chamber 32 for maintaining a predetermined space between the base member 18 and the bottom edge 68 of the barrier member 14 for allowing a substantially unrestricted flow of water emerging from the conduits 30.

These standoffs 66 should also have a plurality of elongated apertures 70 formed therein and therethrough for minimizing any damming of the water in the space between the bottom edge 68 and the base member 18. It is preferred that the barrier assembly 10 include a secondary sealing device generally identified as 72 for use when more than one barrier module 15 is used to span between end members 24 and 26. This secondary sealing device 72 is used to minimize the amount of contaminants that may enter the chamber through any gap 73, seen more clearly in FIG. 5, that may be present between the adjacent barrier members 14. This secondary sealing device 72 includes a floatable H-shaped member 74 that is guided in the passageway 54 and abuts the bumpers 60 to effect a face seal there-between when the barrier member 14 is fully extended. Some non-limiting examples of a buoyant material for the H-shaped member 74 are an epoxy-clad foam, a treated wood, a light plastic, and the like.

Figure 1:
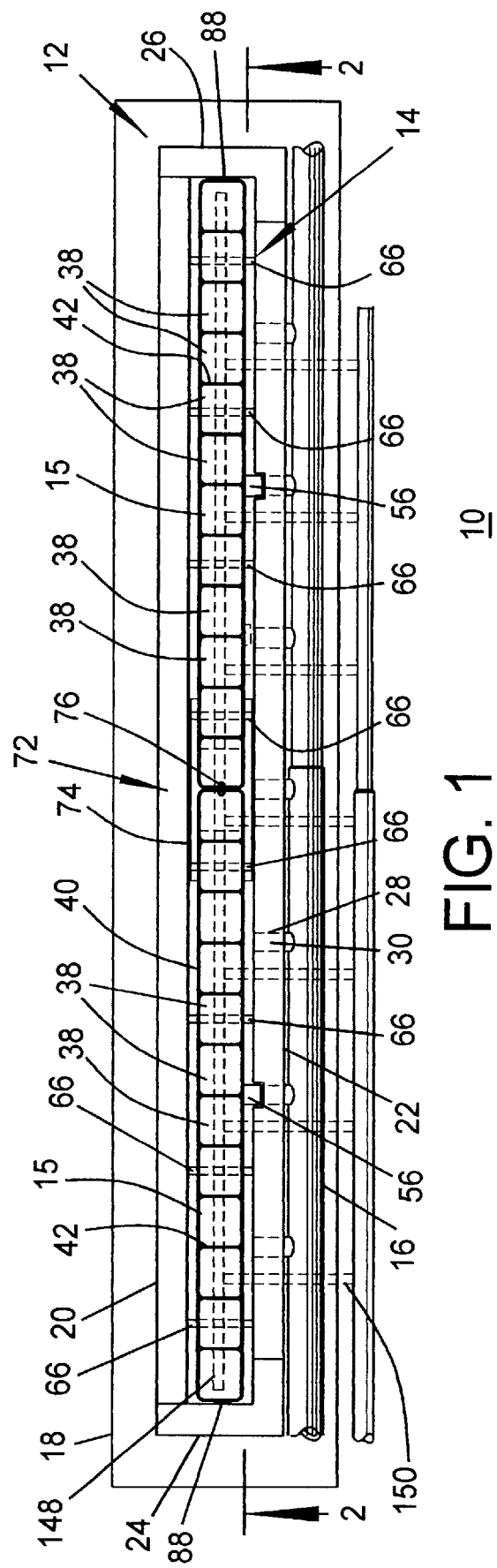
FIG. 1 represents a plan view of one embodiment of a movable barrier system of the present invention.

Referring now to FIGS. 1 through 7, when a plurality of the barrier member Modules 15 are used to form the elongated barrier member 14, as depicted in FIGS. 1 and 2, it is necessary to provide a vertical seal member 76 that is seated in elongated inserts 46 of the barrier member modules 15. This vertical seal member 76 should be able to accommodate relative movement between adjacent barrier members 14 in the direction of the arrow "A", shown in FIG. 6, and at ninety degrees thereto while minimizing the passage of water between the barrier member modules. Movement of one barrier member module 15 relative to a second barrier member module 15 may occur during a flood condition when and as a large floating object impacts one barrier member 14. One non-limiting example of a vertical seal member 76 is an elastomer material that includes a generally V-shaped web portion 78 that terminates with bulbous end portions 80 that snugly fit into at least one of the elongated inserts 46.

Figure 5A:
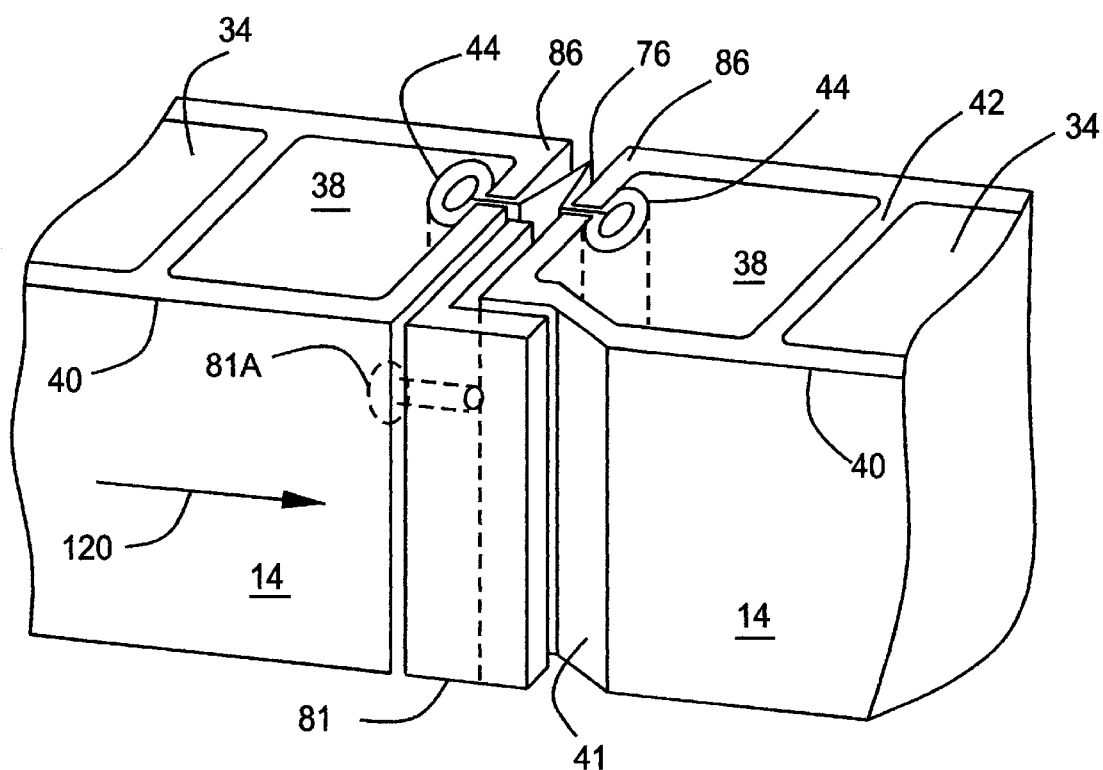
FIG. 5A represents an isolated perspective view, in an enlarged scale, of an impact distributing element between two adjacent barrier member modules that are in close proximity to each other.

Referring now to FIG. 5A an additional full height longitudinal impact resistant/distributing bracket element 81 is affixed to each barrier module 15 downstream waterside end surface 86 by either bolted means 81A or made integral through original one step manufacturing of the barrier member 14. The longitudinal impact resistant/distributing bracket element 81 coincides with tapered indent 41 set into an adjacent barrier member's 14 upstream waterside end surface 86. This fit is contiguous with the flat surface 40 of the barrier member module 15.

The purpose of the longitudinal impact resistant/distributing bracket element 81 is two-fold. First it is designed to limit the relative movement between adjacent barrier modules 15 in a lateral direction. Second it distributes the impact forces of striking debris to downstream barrier members 14 during hydraulic loading.

As potential striking debris floats down the body of water 120 and impacts into a raised barrier member 14 the tapered indent 41 allows the series of longitudinal impact resistant/distributing bracket elements 81 to dissipate the impact energy throughout the series of adjacent downstream barrier members 14 whereby reducing the overall impact loading effect on the movable barrier assembly 10.

The longitudinal impact resistant/distributing bracket element 81 also protects the vertical seal member 76 during impact events during hydraulic loading. Without the longitudinal impact resistant/distributing element system an impact event might tip back a single barrier member 14 far enough to expose the end surface 86 of the downstream barrier member 14 to be further damaged by the striking debris element.

Referring in particular to FIGS. 2, 3, and 4, it is preferred that a lower guide member 82 be fastened to or molded into the barrier member 14 at or near its' bottom edge. This lower guide member 82 minimizes the amount of lateral deflection or movement of the barrier member 14 in the direction of arrow "B" under flood conditions and/or as a result of an impact by a floating object. This lower guide member 82 should be sized for allowing a small gap between it and the interior of the first side panel 20 to limit frictional drag while the barrier 14 is rising within the chamber 32. The small gap should be sufficient for allowing the water in the chamber 32 to act as a lubricant while minimizing the lateral movement of the top portion 84 of the barrier member 14 as discussed above. During the times of hydraulic loading as the barrier member 14 is urged towards the land side, the lower guide member 82 also acts as an impact resistant element for the movable barrier assembly 10.

Referring now to FIGS. 1, 2, and 6A, the barrier members 14 are designed for spanning between the left end member 24 and the right end member 26. These end members 24 and 26 should project vertically above the side panel member 20 and 22 by at least the distance that the barrier member 14 travels upward during floatation. It is good practice to have the ends 24 and 26 project vertically at least 1 meter (3 feet nominally) above the tops of panels 20 and 22, as an allowance for unusual flood conditions. The end surface 86 of the elongated barrier member 14 should include an elongated end seal 88 that cooperates or abuts with a smooth flat elongated non corrosive plate 90 that is attached to an inside surface of the left end member 24 and the right end member 26, as more clearly seen in FIG. 6A. It is also preferred that end members 24 and 26 include a right angle leg portion, as seen in FIGS. 1 and 6A, for acting as a limit for lateral movement of the ends 86 of the barrier member 14 of arrow "B".

Referring now to FIG. 7A shows the vertical seal member 76 mounted inside elongated slot 44 inside elongated insert 46 of core 34 at end surface 86 and adjacent end surface 87 of barrier member 14. One bulbous end portion 80 is securely fixed to elongated insert 46 as the opposite bulbous end portion 80 is allowed to move freely inside elongated slot 44. This sliding fit between adjacent barrier members 14 with the expandable V-shaped web portion 78 allows for the independent lateral motion between barrier members 14 through the gap area 73 during both the hydraulic loading and any impact debris 121 strikes. To seal gap 73 between end surface 86 and adjacent end surface 87 of adjacent barrier members 14 during the hydraulic loading of the body of water 120 the vertical seal member 76 is biased against the far edge of the interior of the elongated insert 46 as the V-shaped web portion 78 and bulbous end portions 80 become extended and compressed. As the body of water 120 subsides the seal is unmade as the independent bulbous end portion 80 becomes free to move inside elongated slot 44.

One application of the present invention is depicted schematically in FIG. 8. In this embodiment the movable barrier assembly 10 is installed in a concrete structure such as a levee or a dam 92. The distribution manifold assembly 16 is connected to a pumping facility 94 by way of a suitable conduit 96. The pumping facility 94 includes a first sump 98 and a second sump 100. Each of the sumps 98 and 100 are water tight, both from internal and external pressure. Any removable covers, not shown, should be bolted down with a gasket, and be of a sufficient strength to withstand anticipated internal and external pressures. It is preferred that each sump be structurally sound and they should not float when the sumps are empty. Each sump 98 and 100 should include at least one venting means 102. The venting means 102 should be of a sufficient height so that a top of its' stack is higher that the anticipated highest level of an adjacent body of water. Each of the sumps 98 and 100 may be connected in common to the venting means 102 by a vent conduit 104. This vent 102 and conduit 104 allows air to escape from the sumps 98 and 100 while filling with water. The vent 102 also acts as a vacuum relief when the sumps are being drained of water. A first submersible pump 106 and a second submersible pump 108 are located interior of each sump 98 and 100 respectively. Preferably the pumps 106 and 108 are mounted on vertical guide bars, not shown for easy installation and removal. This type of vertical guide bar mounting arrangement allows each pump to be connected to their respective conduits automatically when lowered into an operating position. A discharge port 110 of pump 106 is in fluid communication with conduit 96. An automatically operated first gate 112 is installed between the conduit 96 and the discharge port 110. An automatically operated second gate 114 is installed between the inlet port 116 of the second pump 108 and the conduit 96. The discharge port 118 of the second pump 108 may be piped into the first sump 98. The first sump 98 is in fluid communication with a body of water 120 such as a river or lake by a suitable pipe 122, which is disposed beneath the housing assembly 12, therefore allowing communication between sump 100 and the body of water 120. A combination intake/discharge fitting 124 is attached to the end of the pipe 122 distal the pump 106. This fitting 124 should be configured and positioned for allowing only water to enter the pipe 122. Grates, screens and or apertures may be used at any entry points of the fitting 124 to limit the intake of objects therein or damage to sea life. Preferably, a second level sensing device 127 such as a pressure probe, level detector and the like may be installed in the first sump 98 in addition to the sensing device 126 installed interior of the fitting 124. The control system 128 for the pumps 106 and 108 are located interior of a small building 130. The control system 128 may have several modes of operation that include "Automatic" and "Manual". It is preferred that a manually operated gate valve 132 be installed at the end of pipe 122 distal the fitting 124 for use when draining the interior of the sumps for maintenance and service. Alternatively the discharge port 118 of the second pump 108 may be directly piped to the body of water 12 by an alternative drain 123, shown is dashed outline.

In the "Automatic" operating mode, one or both of the level sensing devices 126 and 127 detects that the body of water has reached a pre-set "Trigger" point or elevation and transmits an "ON" signal to the control system 128. The "Trigger" point should be set high enough and the pipe 122 be of a sufficient diameter for allowing the filling of the housing 12 while maintaining a sufficient level of the fluid in the sump 98 for minimizing cavitation at the pump 106. Alternatively, the second sensing device 127 or level control may be wired in series with the first sensing device 126 for insuring that a sufficient amount of water is interior of the sump 98 for minimizing pump burn out when the sensing means 126 is above a "Trigger" point. The control system 128 responds by energizing the first pump 106 to pump the water to the movable barrier assembly 10 by way of conduit 96. The automatically operated first gate 112 allows the water to flow to and towards the movable barrier system 10. The water entering the movable barrier assembly 10 causes the barrier members 14 to rise to an elevated condition as seen in FIG. 4. The barrier members 14 remain at an extended condition while the body of water is at a level above a top surface 134 of the levee 92. A third level sensing device 135 monitors the elevation of the body of the water and sends its' reading to the control system 128. When the pressure reading in the third level sensing device 135 exceeds a predetermined point, indicating the body of water is above the top surface 134, the power to the first pump 106 may be disconnected because the water level in the system 10 will keep the barrier members 14 in a floating and an extended condition. After the body of water recedes, for a predetermined period, the control system energizes the second pump 108 and its associated valve 114 for evacuating the water interior of the chamber 32 of the movable water system 10 in an accelerated manner and returns it to the body of water 120 by way of pipe 122.

It is to be noted that the system depicted in FIG. 8 will also raise the barrier members 14 in a passive manner in the event of either a pump 106 failure or due to human error during a flooding emergency. Water from the rising body of water 120 will flow into the chamber 32 as it seeks it own level in a closed system.

The manual mode of operation may be used to test the operation of the system, routine service or after a forecast of an imminent flood condition and a visual determination by a separate monitoring device indicates that the body of water 120 is rising and a failure of sensor 126 has occurred. Authorized personnel would be capable of overriding the automatic system after an access code had been entered into the control system.

The control system 128 may also include a "Circulating" mode for using one or both of the pumps for circulating the fluid in the system when there is a danger of any fluid in the system freezing.

Referring now to FIGS. 3 and 4, a second passive intake system 136 is shown connected to the chamber 32. This second passive intake system 136 includes a sump pit 138, a perforate cover or grate 140, a conduit 142, a through aperture 143 in the first panel 20, and a flap valve 144. The sump pit 138 should be constructed in the levee 92 at a selected vertical position relative to the top surface 134 for filling the chamber 32 before the level of the rising body of water exceeds the top of the barrier member 14. The sump pit 138 and grate 140 should be selectively sized for minimizing the entry of unwanted debris into the chamber 32 while allowing the required flow. The flap valve 144 is configured for allowing water to enter the chamber 32 only when the barrier member 14 is below its' uppermost position and the pit 138 is simultaneously filled with water. When the barrier member 14 is at its uppermost position, the flap valve 144 is moved to a closed position by a cam surface of the lower guide member 82. This system also acts as a silt restricting system for minimizing the entry of contaminants into chamber 32. This second passive system 136 would also act as a secondary backup filling means for the chamber 32 if any or both of the other filling systems are damaged or clogged. The secondary passive intake system or back up system 136 will also ensure that the barrier member 14 remains at or near full extension as long as the water level of the body of water 120 is above the grate 140. An additional benefit of the second passive system 136 is to act as a venting means for the chamber 32 when the barrier members 14 are moving rapidly towards the fully extended condition. It is preferred that at least one-second passive system be used for each individual module of the barrier members 14.

Referring now to FIG. 3 and 8. The water for the movable barrier system 10 is being drawn from the body of water 120 and may contain fine silt that may eventually end up being deposited and collected in the chamber 32. It is preferred that a silt cleaning system, generally identified as 146 be provided and installed with the system 10. This silt cleaning system 146 should include a spray manifold 148, a supply conduit 150, and a control valve 152 that is connected to clean water such as a town water supply or a tanker truck filled with water. The spray manifold 148 is supported by the standoffs 66. A trough 154 is formed in the base member 18 along with at least one drain or passageway 156. The drain 156 is preferably connected to the second sump 100 by a valve 157 and drainpipe 158. The valve 157 should be closed when the control system is in an "Automatic" or "Manual" filling mode. The silt cleaning system 146 is intended for manual cleaning and/or periodic maintenance for the movable barrier system 10. In operation, the silt cleaning system 146 is intended for use when the body of water is at or near its' low level and preferably below the level of the fitting 124. Maintenance personnel open the control valve 152 allowing clean water to be sprayed from the spray manifold 148. It is also necessary for the personnel to open valve 157 for allowing the drained fluid to enter the sump 100. Preferably a plurality of spray apertures 159 are angularly positioned in the neighborhood of 60 degrees from vertical and are spaced at selected intervals along the manifold 148 for directing jets of clean water to and towards the lower corners of the chamber 32. The jets of water will wash most of the silt from the bottom of the chamber 32 and carry the silt in suspension to the second sump 100. The second pump 108 may be manually actuated for pumping the silt towards and into the body of water by way of pipe 122. The silt cleaning system 146 may be operated until clear water is observed entering the second sump 100. Alternatively, the drainpipe 158 may pass through the sump 100 and continue to the body of water 120. In this alternate arrangement the valve 157 would be housed in the sump 100 for easy access for the manually opening and closing thereof.

Referring now to FIGS. 8A and 8B, a distribution manifold assembly 16 directs water through the first sump 98 and second sump 100 via conduit 96 to the distribution manifold assembly 16 to the various movable barrier assembly units 10. Conduit 96 ends at the distribution manifold assembly 16 at T-joint 99 which then distributes the water through the distribution manifold assembly 16 to sets of movable barrier assembly units 10 at right angles to conduit 96. The discharge port 118 is used in the draining of the movable barrier assembly units 10.

Referring now to FIG. 8B, a selectively sized and graduated series of conduits 16 sized as 200, 201 and 202 along with connector conduits 30 sized as 210, 211 and 212 to provide uniform water flow and water pressure to chamber 32. The intent of the distribution manifold system 16 is to control all of the barrier members 14 in the system to rise and fall simultaneously from a single central input and drain source.

Referring now to FIG. 9, an alternate arrangement for activating the movable barrier system 10 is depicted. This alternate arrangement may also include an automatic and manual mode of operation. In this arrangement the source of water is at least one tank or pool 160 of relatively clean water that has a sufficient volume for fully extending all barrier members 14. The upper level of the water in the tank or pool 160 should be at or below the level of the base member 18. The automatic operation of this alternate system is similar to that previously described in conjunction with FIG. 8. The first level sensor device 126 sends a signal to the control system 128 for actuating the first pump 106. The water in the pool 160 is pumped into the chamber 32, by the first pump 106, for elevating the barrier member 14 to its' extended position, as depicted in FIG. 4. It is preferred that a second level sensing device 127 be installed interior of the sump 98 for protecting the pump 106 from a lack of water therein. The control system 128 keeps the barrier member 14 at its extended position as long as the sensing device 126 senses the level of the body of water 120 to be above a predetermined limit. After the water recedes below the predetermined limit, the control system energizes the second pump 108 for accelerating the return of the water to the pool 160 for retracting the barrier member 14. This alternate system may include a passive intake system similar to second passive intake system 136 and operates in a similar manner. Any alternate system that includes a passive intake system similar to system 136 should include a silt cleaning system similar to system 146 with the exception that the drain pipe 158 be connected to the river by way of the sump 100 and include a manual valve 157 similar to the system described above.

Figure 10:
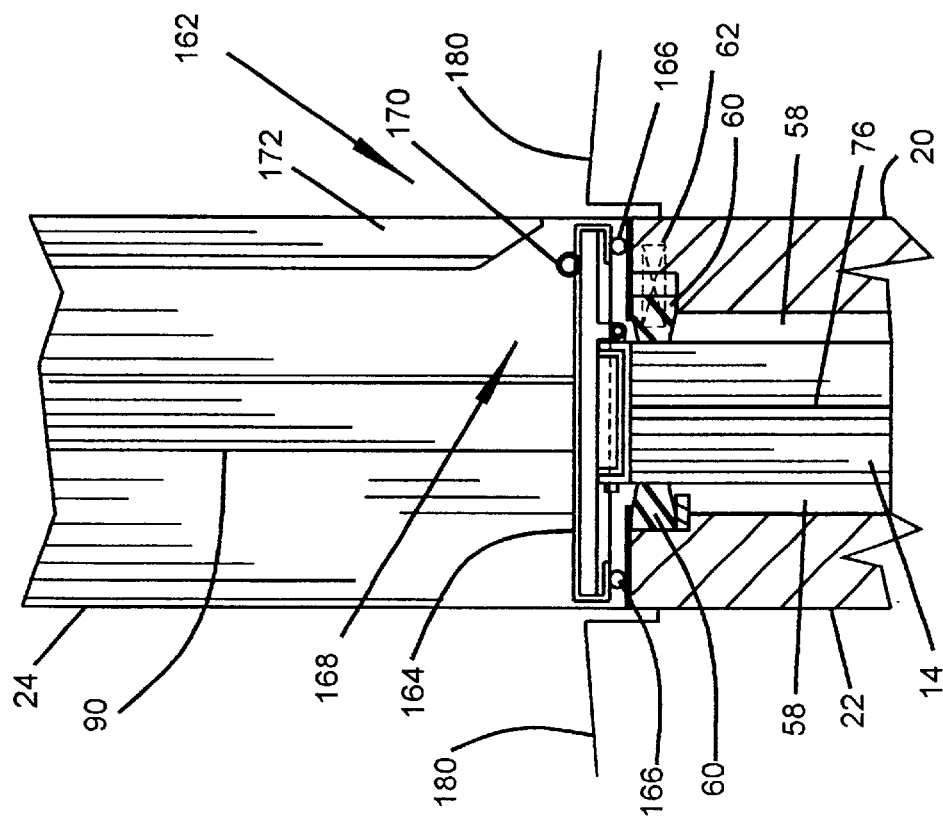
FIG. 10 represents an enlarged section of a top portion of a barrier member. This view shows a system protection cap assembly.

Referring now to FIGS. 10 and 11, in most applications it is desirable to provide a protective cap assembly, generally identified as 162, for minimizing of the entry of contaminants into the movable barrier system 10. This protective cap assembly 162 will also act as a vandal deterrent by not allowing access to the chamber 32 or bumpers 60 unless the barrier member 14 is raised. It is preferred that the protective cap assembly 162 be removably attached to the top of the barrier member 14.

Preferably the protective cap assembly can only be removed when the barrier member 14 is raised a convenient distance for access to its fasteners. The protective cap assembly 162 should include a shaped cap 164, and a perimeter seal member 166. The perimeter seal member 166 contacts the housing assembly 12 when and while the barrier member 14 is in its retracted or lowered position for limiting the entry of water, dirt, and foreign object into the movable barrier system 10. In its elementary form the protective cap assembly 162 is stationary with respect to the barrier member 14, meaning that the shaped cap 164 remains in a fixed substantially horizontal position during the extension and retraction of the barrier member 14. This arrangement will satisfy the basic criteria for a protective cap, meaning the minimizing of the entry of contaminants into the movable barrier system 10 as well as a vandal deterrent. However the protective cap assembly 162 can provide an additional benefit, namely an extension of the height of the barrier member 14 by providing a pivotal mounting arrangement for the protective cap assembly 162. In this pivotal arrangement of the protective cap assembly 162, the shaped cap 164 and seal member 166 are rotated in the direction of the arrow to a substantially vertical position as the barrier member 14 is lifted from its retracted position by a rotating device generally identified as 168. One non-limiting example of a rotating device 168 is a cam roller 170 and cam track 172 that cooperate to rotate the protective cap assembly 162 during the elevation of the barrier member 14. The cam track 172 may be mounted on end member 24 and/or end member 26 or any other suitable location. The protective cap assembly 162 is returned to its horizontal position by a return cam 174 or a biasing means. One non-limiting example of a biasing means is a torsion spring 176 that is mounted on the pivot shaft 178.

Referring still to FIGS. 10 and 11, the movable barrier assembly 10 of the present invention may be also be installed across a road 180 that has a levee or sea wall on each side, similar to the arrangement depicted in FIG. 2. The top surface of the protective cap assembly 162 should slightly above the surface of the road 180. The shaped cap portion 164 should have a sufficient strength for the anticipated loading due to the vehicle weight. The shaped cap portion may need to be crowned for following the contour of the road 180.

Referring again to FIG. 3 and 4 the movable barrier assembly 10 may include a drain 182 that is formed into a walkway 220 that is on a side opposite to the side of the body of water 120 and abutted to walkway indent 196 of second side panel 22. This drain 182 should include a perforated cover member 184 and a curb 234. This drain 182 should be positioned to receive any small amounts of water that may possibly seep beyond the extended barrier member 14.

Figure 9A:
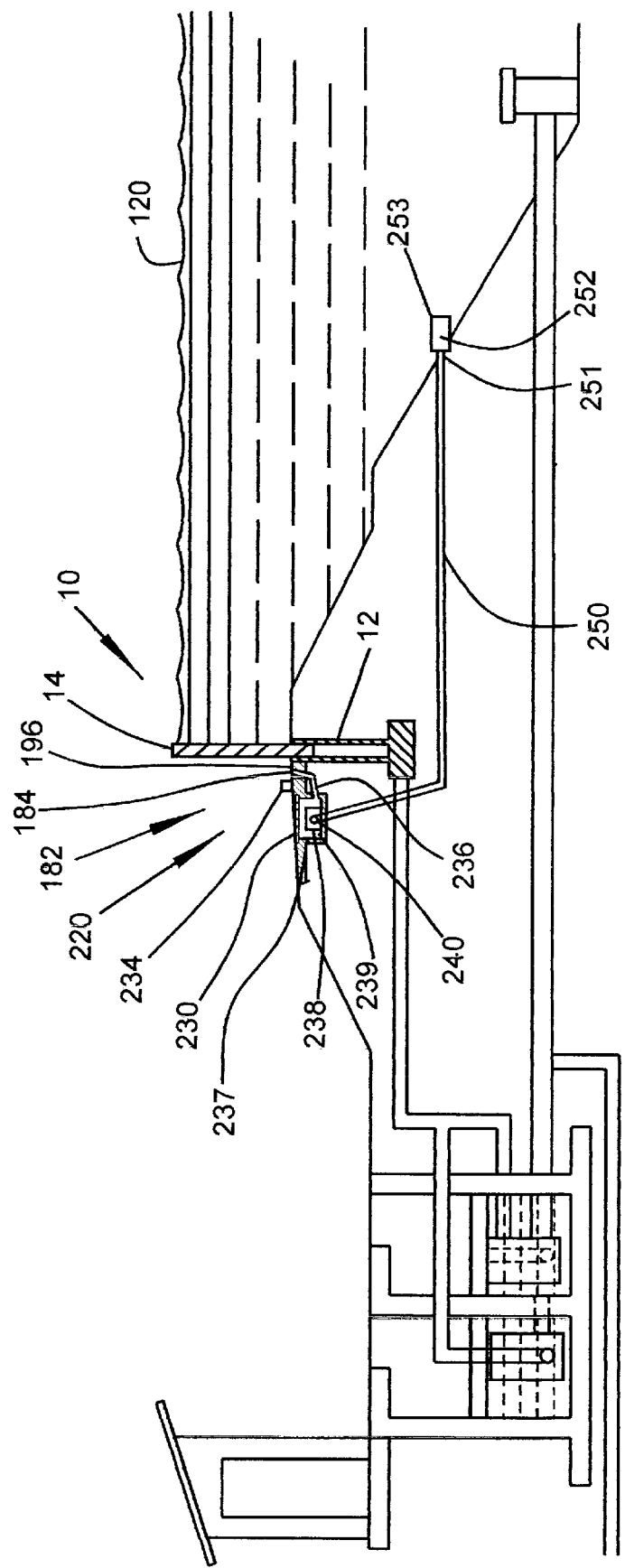
FIG. 9A represents a sectional view of an alternate installation of the present invention. This view being partly schematic and showing the present invention with a drainage system which returns amounts of fluid that leaks past the movable barrier assembly back to the body of water during the hydraulic event.

Referring to FIG. 9A shows drain 182 emptying into a drain sump 237 through drain conduit 236, that includes an automatically operated submersible drain pump 238. The drain pump 238 having an inlet port 239 and outlet port 240 would return the small amounts of water to the main body of water 120 through a lower return conduit 250 to the body of water 120. An anti-siphon device 251 and a one way check valve 252 is selectively positioned intermediate the body of water outlet port 253 to allow the flow only to and towards the body of water 120.

As previously mentioned, the control system of the present invention may present operated in an "automatic" or a "manual" mode. The control system 128 of the present invention may be manually operated from a remote location by directly wired electrical connection or by a wireless connection, such as radio waves. The control system 128 should include a back-up generating system that may be operated by propane, natural gas and the like in the event of an electrical power failure during a flooding situation.

The control system of the present invention allows the movable barrier assembly 10 to be manually extended for regular maintenance and/or inspection. Most importantly the barrier members 14 may be elevated to a flood protection mode in advance of the actual flooding by the body of water 120. The present invention may be installed as part of a dam or levee system or as elongated extendable barrier system. The modular construction of the barrier member modules and the vertical seal members 76 allow the barrier member modules 15 to be installed as chord sections along a bend or a curve in a river. The length of the barrier member modules 15 may be sized to suit the particular bends. As one non-limiting example, it is believed that barrier member modules 15 that are made in lengths of 6.1 meters (20 feet nom.) will satisfy most applications for elongated linear or curved applications. It is to be noted that shorter lengths of the barrier modules will allow the system 10 to be used at sharper bends in the river.

Referring to FIG. 12, an alternate place to mount the movable barrier assembly 10 is directly inside the body of water 120 along the riverbank. This placement is necessary if houses or buildings, not shown, are built on the levee or dam 92, right to the edge of the body of water 120. The second passive intake system 136 is incorporated in this system as well as the intake/discharge fitting 124. The barrier members 14 would be mounted inside similar housing assemblies 12 with the addition of leg piles 186 to aid in the stability of the system 10.

Referring still to FIG. 13 shows the movable barrier assembly 10 with five extended barrier members 14 raised to block the body of water 120 from breaching the movable barrier assembly 10. An impact debris element 121 is shown striking the gap 73 between two barrier members 14 whereby deflecting only the two adjacent barrier members 14 back from the first side panel 20 towards the second side panel 22. FIG. 13 depicts the concept that a plurality of barrier modules 14 lineally aligned in chamber 32 are designed for independent relative movement between adjacent barrier modules 14. The ability for a single barrier member 14 to independently deflect and then return to its upright initial position after an impact element 121 strikes the barrier member 14 improves and increases the overall energy absorption ability of the movable barrier system 10.

Referring still to FIG. 14 depicts the movable barrier assembly 10 mounted inside the levee or dam 92 whereby silt distribution manifold 151 being connected to control valve 152 circulates pressurized water through supply conduit 150 into spray manifold 148 entering interior 32 through spray apertures 159. Control valve 152 can be selectively operated to actuate the silt cleaning system. In this embodiment supply conduit 150 is feed through base member 18 of housing assembly 12 where the barrier member 14 is housed between the first side panel 20 and second side panel 22. Control valve 152 is set just underneath top surface 134 for easy access. A separate water supply from either a pressurized civil source, a portable water truck or from the body of water 120 can be utilized to circulate water into the system to clean out silt and contaminants. This system is independent of the main distribution manifold 16 where water from the body of water 120 is used to raise the barrier members 14.

Referring still to FIG. 14A depicts the movable barrier assembly 10 mounted inside the levee or dam 92 whereby its source of intake water originates from a pressurized civil source 149. The pressurized civil source 149 may also be utilized with the distribution manifold assembly 16. Not shown is a series of one way valves selectively position being configured for allowing flow only to and towards the movable barrier assembly 10.

Referring still to FIG. 15 shows a series of supply conduits 150 independently fed through silt distribution manifold 151 through individual control valves 152 into sets of housing assembly 12. Also shown are series of barrier members 14 placed between first side panel 20 and second side panel 22. To accommodate the large hydraulic turbulence required for the silt cleaning system a limited series of individual control valves 152 are shown activated 153 to accommodate the desired number of housing assemblies 12 to be cleaned at one time.

Referring now to FIGS. 16, 17 and 18 depicts preset indents, guide tracks, holes and stand-offs to accommodate various pre-manufactured elements into the movable barrier assembly 10.

FIG. 16 shows central guide track 190 accommodating elongated stop member 56 mounted on the lower center back portion of each barrier member 14 (shown in shadow). Projecting bar 64 is mounted on top of projecting bar indent 192 by projecting bar bolts 65 through pre-made projecting bar bolt mounting holes 193. The bolted in projection bar 64 stops the rising barrier member 14 from floating out of housing assembly 12.

Bumper 60 is fitted onto the inside top edge of second side panel 22 along second side panel bumper indent 194. Bumper 60 is bolted into place through assembly bumper T-bar 202 inside bumper T-bar indent 200 using bumper T-bar bolts 206 fitting into bumper T-bar mounting holes 201. Bumper 60 is attached to bumper T-bar 202 though bumper mounting holes 204 using T-bar bolts 206. Bumper 60 acts as both an impact element for barrier member 14 as barrier member 14 contacts bumper 60 as barrier member 14 deflects back during hydraulic loading and as a top closure water stop for clearance 58 as it extends out over clearance 58.

Walkway detent 196 is cast across the full length of second side panel 22 to receive walkway 220 that abuts against the back of second side panel 22. Attaching walkway 220 to second side panel 22 strengthens the overall structural capacity of the housing assembly 12 during hydraulic loading.

Second side panel grout track 198 allows for quick setting of adjacent second side panel units 22 through the use of side panel grout 208.

FIG. 17 shows first side panel 20 with first side panel bumper indent 210 inside top edge of first panel bumper 20. Aperture 143 cored through first side panel 20 connects to conduit 142 for second passive intake system 136. Flap valve 144 covers aperture 143 as passive intake assembly indent 212 allows for easy assembly and removal of flap valve 144 during construction. First side panel grout tracks 211 allows for quick setting of adjacent first side panel units 20 through the use of side panel grout 208.

FIG. 18 shows base member 18 with integral standoffs 66 on which barrier member 14 rests. The pitched base 69 of base member 18 guides all water, silt and contaminants towards the center of base member 18 towards an outlet drain.

The silt cleaning system is a preferred sub-system of the invention as the body of water 120 contains microscopic particles of silt which coagulate and rest on the bottom of the interior 32 which will impede barrier member 14 from returning to its initial position.

Referring still to FIG. 19 an intake/discharge fitting 124 for pipe 122 is shown. The intake/discharge fitting 124 is mounted in levee or dam 92 at an elevation that is typically higher than the average elevation of the body of water 120. As the body of water 120 begins to rise above intake/discharge fitting 124 water is filtered through the series of screens 264 where it enters interior chamber 271. Cover plate 268 is raised by spacer plates 262 and surrounded by movable cleaning cylinder 272 that creates interior chamber 271. The filtered water is then led into intake aperture 260 through a secondary screen 261 to steel pipe 280 where it is led through aperture 282 that is also screened 283. The water is then led into pipe 122 towards first sump 98. In reverse the water in interior 32 is first cleaned from its silt with the remaining water pumped back out to intake/discharge fitting 124 by the second submersible pump 108 through pipe 122. To clean silt or contaminants out of interior chamber 271 movable cleaning cylinder is manually removed in the direction of movable cleaning cylinder 273 whereby all debris falls out 274. Movable cleaning cylinder 272 is then replaced and the system is again ready for use.

Directional terms such as "front", "back", "in", "out", "downward", "upper", "lower" "retracted", "extended", and the like may have been used in the description. These terms are applicable to the embodiments shown and described in conjunction with the drawings. These terms are merely used for the purpose of description in connection with the drawings and do not necessarily apply to the position in which the present invention may be used.

While these particular embodiments of the present invention have been shown and described, it is to be understood that the invention is not limited thereto and protection is sought to the broadest extent that the prior art allows.

What is claimed is:

1. A movable barrier floodwall system including:
    a) a housing having a chamber formed by a base member, a first side panel member, a second side panel member, a left end member, and a right end member;
    b) a barrier member being vertically movable interior of said chamber, said barrier member having a selected density for allowing floatation thereof as and when a liquid is present interior of said chamber;
    c) at least one first pump assembly having an inlet port and an outlet port, said inlet port being in fluidic communication with a supply of the liquid, said liquid having a selected liquid density greater than the selected density of the barrier member, said outlet port being in fluidic communication with said chamber by way of a distribution manifold assembly; and
    wherein, each first pump is selectively actuated by a control system for filling said chamber with said liquid for causing said barrier member to float within said chamber for extending a selected portion of said barrier member above an upper surface of said housing.

2. A movable barrier floodwall as recited in claim 1 wherein said selective actuation occurs prior to a flooding condition of a body of water.

3. A movable barrier floodwall as recited in claim 2 wherein each first pump is a submersible pump that is housed in a first sump chamber.

4. A movable barrier floodwall as recited in claim 2 which further includes a second pump that is housed interior of a second sump chamber, an inlet port of said second pump being in fluidic communication with said chamber of the housing for selective draining thereof.

5. A movable barrier floodwall as recited in claim 2 wherein said selected density of said barrier member is between 240.3 and 480.6 kilograms per cubic meter (15 and 30 Pounds per cubic foot).

6. A movable barrier floodwall as recited in claim 1 wherein each first pump is a submersible pump that is housed in a first sump chamber.

7. A movable barrier floodwall as recited in claim 6 which further includes at least one passive filling device for filling said chamber with said liquid, said liquid being from a body of water as that body of water reaches a predetermined flooding level for causing said barrier member to float within said chamber for extending the selected portion of said barrier member above the upper surface of said housing when and if said first pump is inoperable.

8. A movable barrier floodwall as recited in claim 7 wherein at least one of the passive filling devices includes a flap valve, said flap valve allowing the fluid to enter the chamber when said barrier member is below a predetermined point of floatation and said flap valve is urged closed by a guiding member of said barrier member when said barrier member is near its full extent of floatation for minimizing further entry of said fluid into said chamber.

9. A movable barrier floodwall as recited in claim 6 wherein said selected density of said barrier member is between 240.3 and 480.6 kilograms per cubic meter (15 and 30 Pounds per cubic foot).

10. A movable barrier floodwall as recited in claim 1 which further includes a second pump that is housed interior of a second sump chamber, an inlet port of said second pump being in fluidic communication with said chamber of the housing for selective draining thereof.

11. A movable barrier floodwall as recited in claim 10 which further includes at least one passive filling device for filling said chamber of the housing with said liquid, said liquid being from a body of water as that body of water reaches a predetermined flooding level for causing said barrier member to float within said chamber of the housing for the extending of the selected portion of said barrier member above the upper surface of said housing when and if said first pump is inoperable.

12. A movable barrier floodwall as recited in claim 11 wherein at least one of the passive filling devices includes a flap valve, said flap valve allowing the fluid to enter the chamber of the housing when said barrier member is below a predetermined point of floatation and said flap valve is urged closed by a guiding member of said barrier member when said barrier member is near its full extent of floatation for minimizing further entry of said fluid into said chamber.

13. A movable barrier floodwall as recited in claim 10 wherein said selected density of said barrier member is between 240.3 and 480.6 kilograms per cubic meter (15 and 30 Pounds per cubic foot).

14. A movable barrier floodwall as recited in claim 1 which further includes at least one passive filling device for filling said chamber with said liquid, said liquid being from a body of water as that body of water reaches a predetermined flooding level for causing said barrier member to float within said chamber for extending the selected portion of said barrier member above the upper surface of said housing when and if said first pump is inoperable.

15. A movable barrier floodwall as recited in claim 14 wherein at least one of the passive filling devices includes a flap valve, said flap valve allowing the fluid to enter the chamber when said barrier member is below a predetermined point of floatation and said flap valve is urged closed by a guiding member of said barrier member when said barrier member is near its full extent of floatation for minimizing further entry of said fluid into said chamber.

16. A movable barrier floodwall as recited in claim 15 wherein said selected density of said barrier member is between 240.3 and 480.6 kilograms per cubic meter (15 and 30 Pounds per cubic foot).

17. A movable barrier floodwall as recited in claim 14 wherein said selected density of said barrier member is between 240.3 and 480.6 kilograms per cubic meter (15 and 30 Pounds per cubic foot).

18. A movable barrier floodwall as recited in claim 1 wherein said selected density of said barrier member is between 240.3 and 480.6 kilograms per cubic meter (15 and 30 Pounds per cubic foot).

19. A movable barrier floodwall system including:
a) a housing having a chamber formed by a base member, a first side panel member, a second side panel member, a left end member, and a right end member;
b) a barrier member being vertically movable interior of said chamber, said barrier member having a selected density for allowing floatation thereof as and when a liquid is present interior of said chamber for extending a selected portion of said barrier member above an upper surface of said housing the barrier member further including a closed cell foam core that is encased in a mesh cover member that has been infused with a resin material; and
wherein, the housing further including at least one passive filling system for allowing the liquid to enter the interior of said chamber for extending the selected portion of said barrier member above the upper surface of said housing, said passive filling system including a flap valve, said flap valve allowing the fluid to enter the chamber when said barrier member is below a predetermined point of floatation and said flap valve is urged closed by said barrier member as and when said barrier member is near its full extent of floatation for minimizing further entry of said fluid into said chamber.

20. A movable barrier floodwall as recited in claim 19 wherein the mesh cover material is an E-glass non-metallic mesh.

21. A movable barrier floodwall as recited in claim 20 which further includes a shear layer of a mesh material that is disposed between the closed cell foam core and the mesh cover layer for acting as a reinforcement.

22. A movable barrier floodwall as recited in claim 20 wherein the barrier member includes a first flat surface, an opposite surface and end surfaces, said opposite surface carrying at least one elongated stop member projecting a selected distance therefrom for abutting an elongated projecting bar removably attached near said upper surface of said housing for controlling the extending of the selected portion of the barrier member above the upper surface of said housing to a predetermined limit.

23. A movable barrier floodwall as recited in claim 22 wherein each end surface of the barrier member includes an elongated seal device for minimizing a passage of the liquid between each end surface of the barrier member and any adjacent structures.

24. A movable barrier floodwall as recited in claim 20 which further includes a lower bumper guide member that is horizontally disposed on and near a bottom portion of the first flat surface and projects a predetermined distance therefrom for minimizing any lateral deflection of a top portion of said barrier member as and when the liquid is present interior of said chamber for extending the selected portion of said barrier member above the upper surface of said housing.

25. A movable barrier floodwall as recited in claim 24 wherein said flap valve is urged closed by the lower bumper guide.

26. A movable barrier floodwall as recited in claim 19 which further includes a shear layer of a mesh material that is disposed between the closed cell foam core and the mesh cover layer for acting as a reinforcement.

27. A movable barrier floodwall as recited in claim 26 wherein the barrier member includes a first flat surface, an opposite surface and end surfaces, said opposite surface carrying at least one elongated stop member projecting a selected distance therefrom for abutting an elongated projecting bar removably attached near said upper surface of said housing for controlling the extending of the selected portion of the barrier member above the upper surface of said housing to a predetermined limit.

28. A movable barrier floodwall as recited in claim 27 wherein each end surface of the barrier member includes an elongated seal device for minimizing a passage of the liquid between each end surface of the barrier member and any adjacent structures.

29. A movable barrier floodwall as recited in claim 27 which further includes a lower bumper guide member that is horizontally disposed on and near a bottom portion of the first flat surface and projects a predetermined distance therefrom for minimizing any lateral deflection of a top portion of said barrier member as and when the liquid is present interior of said chamber for extending the selected portion of said barrier member above the upper surface of said housing.

30. A movable barrier floodwall as recited in claim 29 wherein said flap valve is urged closed by the lower bumper guide.

31. A movable barrier floodwall as recited in claim 26 which further includes a lower bumper guide member that is horizontally disposed on and near a bottom portion of the first flat surface and projects a predetermined distance therefrom for minimizing any lateral deflection of a top portion of said barrier member as and when the liquid is present interior of said chamber for extending the selected portion of said barrier member above the upper surface of said housing.

32. A movable barrier floodwall as recited in claim 31 wherein said flap valve is urged closed by the lower bumper guide.

33. A movable barrier floodwall as recited in claim 19 wherein the barrier member includes a first flat surface, an opposite surface and end surfaces, said opposite surface carrying at least one elongated stop member projecting a selected distance therefrom for abutting an elongated projecting bar removably attached near said upper surface of said housing for controlling the extending of the selected portion of the barrier member above the upper surface of said housing to a predetermined limit.

34. A movable barrier floodwall as recited in claim 33 wherein each end surface of the barrier member includes an elongated seal device for minimizing a passage of the liquid between each end surface of the barrier member and any adjacent structures.

35. A movable barrier floodwall as recited in claim 34 which further includes at least two primary sealing devices, a first of the primary sealing devices being horizontally disposed along a top edge of the first side panel member while in an abutment with a first flat surface of said barrier member, a second of said primary sealing devices being horizontally disposed along the second side panel member and in alignment with said first of the primary sealing devices while abutting an opposite side of said barrier member.

36. A movable barrier floodwall as recited in claim 35 wherein said first of said primary sealing devices includes a seal biasing device for maintaining the abutment with the first flat surface of said barrier member.

37. A movable barrier floodwall as recited in claim 33 which further includes a lower bumper guide member that is horizontally disposed on and near a bottom portion of the first flat surface and projects a predetermined distance therefrom for minimizing any lateral deflection of a top portion of said barrier member as and when the liquid is present interior of said chamber for extending the selected portion of said barrier member above the upper surface of said housing.

38. A movable barrier floodwall as recited in claim 37 wherein said flap valve is urged closed by the lower bumper guide.

39. A movable barrier floodwall as recited in claim 33 which further includes at least two primary sealing devices, a first of the primary sealing devices being horizontally disposed along a top edge of the first side panel member while in an abutment with the first flat surface of said barrier member, a second of said primary sealing devices being horizontally disposed along the second side panel member and in alignment with said first of the primary sealing devices while abutting the opposite side of said barrier member.

40. A movable barrier floodwall as recited in claim 39 wherein said first of said primary sealing devices includes a seal biasing device for maintaining the abutment with the first flat surface of said barrier member.

41. A movable barrier floodwall as recited in claim 19 which further includes a lower bumper guide member that is horizontally disposed on and near a bottom portion of the first flat surface and projects a predetermined distance therefrom for minimizing any lateral deflection of a top portion of said barrier member as and when the liquid is present interior of said chamber for extending the selected portion of said barrier member above the upper surface of said housing.

42. A movable barrier floodwall as recited in claim 41 wherein said flap valve is urged closed by the lower bumper guide.

43. A movable barrier floodwall as recited in claim 42 which further includes at least two primary sealing devices, a first of the primary sealing devices being horizontally disposed along a top edge of the first side panel member while in an abutment with a first flat surface of said barrier member, a second of said primary sealing devices being horizontally disposed along the second side panel member and in alignment with said first of the primary sealing devices while abutting an opposite side of said barrier member.

44. A movable barrier floodwall as recited in claim 43 wherein said first of said primary sealing devices includes a seal biasing device for maintaining the abutment with the first flat surface of said barrier member.

45. A movable barrier floodwall as recited in claim 41 which further includes at least two primary sealing devices, a first of the primary sealing devices being horizontally disposed along a top edge of the first side panel member while in abutment with a first flat surface of said barrier member, a second of said primary sealing devices being horizontally disposed along the second side panel member and in alignment with said first of the primary sealing devices while abutting an opposite side of said barrier member.

46. A movable barrier floodwall as recited in claim 45 wherein said first of said primary sealing devices includes a seal biasing device for maintaining the abutment with the first flat surface of said barrier member.

47. A movable barrier floodwall as recited in claim 19 which further includes at least two primary sealing devices, a first of the primary sealing devices being horizontally disposed along a top edge of the first side panel member while abutting a first flat surface of said barrier member, a second of said primary sealing devices being horizontally disposed along the second side panel member and in alignment with said first of the primary sealing devices while abutting an opposite side of said barrier member.

48. A movable barrier floodwall as recited in claim 47 wherein said first of said primary sealing devices includes a seal biasing device for maintaining the abutment with the first flat surface of said barrier member.

49. A movable barrier floodwall system including:
a) a housing having a chamber formed by a base member, a first side panel member, a second side panel member, a left end member, and a right end member, said housing further including a plurality of standoffs extending vertically from said base member, said base member including an upper surface that forms a lower extent of the chamber, said upper surface having an elongated trough formed therein, the trough being in fluidic communication with at least one drain;
b) a barrier member being vertically movable interior of said chamber, said barrier member having a selected density for allowing floatation thereof as and when a liquid is present interior of said chamber for extending a selected portion of said barrier member above an upper surface of said housing;
c) a silt cleaning system that includes a spray manifold, a supply conduit in fluidic communication with a supply of clean water, and a control valve mounted in said conduit intermediate said supply of clean water and the manifold, said manifold having a plurality of spray apertures for directing the clean water towards lower corners of the chamber, the manifold being supported in a selected spaced relationship with said base member by the standoffs and
wherein, said control valve is selectively opened for allowing the clean water to spray from said manifold for washing and carrying any accumulated silt within the chamber to and towards the drain.

50. A movable barrier floodwall as recited in claim 49 wherein said the plurality of spray apertures are selectively angled with respect to vertical while being spaced a selected intervals along the spray manifold.

51. A movable barrier floodwall as recited in claim 50 wherein said drain is in fluidic communication with a sump providing a housing for a submersible pump, said submersible pump being selectively actuated for disposing of any silt conducted into the sump.

52. A movable barrier floodwall as recited in claim 49 wherein said the plurality of spray apertures are selectively angled at 60 degrees with respect to vertical while being spaced a selected intervals along the spray manifold.

53. A movable barrier floodwall as recited in claim 52 wherein said drain is in fluidic communication with a sump providing a housing for a submersible pump, said submersible pump being selectively actuated for disposing of any silt conducted into the sump.

54. A movable barrier floodwall as recited in claim 49 wherein said drain is in fluidic communication with a sump providing a housing for a submersible pump, said submersible pump being selectively actuated for disposing of any silt conducted into the sump.

55. A movable barrier floodwall system including:
   a) a housing having a chamber formed by a base member, a first side panel member, a second side panel member, a left end member, and a right end member;
   b) a barrier member being vertically movable interior of said chamber, said barrier member having a selected density for allowing floatation thereof as and when a liquid is present interior of said chamber for extending a selected portion of said barrier member above an upper surface of said housing; and
   wherein, the barrier member includes a plurality of elongated closed cell foam rods that are aligned in an abutting relationship to form a floatable core, said floatable core being encased in a mesh cover member that has been infused with a resin material, the barrier member further including a passageway that is formed at each of its lower corners for allowing the fluid to flow freely through the chamber.

56. A movable barrier floodwall system as recited in claim 55 wherein each of the elongated closed cell rods is individually wrapped with at least one shear layer prior to the aligning in the abutting relationship for providing a reinforcement of said barrier member.

57. A movable barrier floodwall as recited in claim 56 wherein each shear layer is a non-metalic E glass mesh.

58. A movable barrier floodwall as recited in claim 57 wherein the barrier member further includes a plurality of barrier member modules that have a predetermined span length, and an elongated vertical seal member being disposed between adjacent barrier member modules for minimizing passage of the liquid there between.

59. A movable barrier floodwall as recited in claim 58 wherein the elongated vertical seal member includes bulbous end portion for seating in elongated slots formed in selected end rods, said elongate vertical seal member further including a V-shaped web portion for allowing selected relative movement between adjacent barrier member modules.

60. A movable barrier floodwall as recited in claim 58 which further includes a secondary sealing member that is retained between adjacent barrier member modules, said secondary sealing member having a density less than the liquid for allowing floatation thereof when the liquid is present in the chamber for minimizing the entry of contaminants into the chamber when the selected portion of the barrier member is above the upper surface of the housing.

61. A movable barrier floodwall as recited in claim 56 wherein the barrier member further includes a plurality of barrier member modules that have a predetermined span length, and an elongated vertical seal member being disposed between adjacent barrier member modules for minimizing passage of the liquid there between.

62. A movable barrier floodwall as recited in claim 61 wherein the elongated vertical seal member includes bulbous end portion for seating in elongated slots formed in selected end rods, said elongate vertical seal member further including a V-shaped web portion for allowing selected relative movement between adjacent barrier member modules.

63. A movable barrier floodwall as recited in claim 61 which further includes a secondary sealing member that is retained between adjacent barrier member modules, said secondary sealing member having a density less than the liquid for allowing floatation thereof when the liquid is present for minimizing the entry of contaminants into the chamber when the selected portion of the barrier member is above the upper surface of the housing.

64. A movable barrier floodwall as recited in claim 55 wherein the mesh cover material is an E-glass non-metallic mesh.

65. A movable barrier floodwall as recited in claim 64 wherein the barrier member further includes a plurality of barrier member modules that have a predetermined span length, and an elongated vertical seal member being disposed between adjacent barrier member modules for minimizing passage of the liquid there between.

66. A movable barrier floodwall as recited in claim 65 wherein the elongated vertical seal member includes bulbous end portion for seating in elongated slots formed in selected end rods, said elongate vertical seal member further including a V-shaped web portion for allowing selected relative movement between adjacent barrier member modules.

67. A movable barrier floodwall as recited in claim 65 which further includes a secondary sealing member that is retained between adjacent barrier member modules, said secondary sealing member having a density less than the liquid for allowing floatation thereof when the liquid is present in the chamber, for minimizing the entry of contaminants into the chamber when the selected portion of the barrier member is above the upper surface of the housing.

68. A movable barrier floodwall as recited in claim 55 wherein the barrier member further includes a plurality of barrier member modules that have a predetermined span length, and an elongated vertical seal member being disposed between adjacent barrier member modules for minimizing passage of the liquid there between.

69. A movable barrier floodwall as recited in claim 68 wherein the elongated vertical seal member includes bulbous end portion for seating in elongated slots formed in selected end rods, said elongate vertical seal member further including a V-shaped web portion for allowing selected relative movement between adjacent barrier member modules.

70. A movable barrier floodwall as recited in claim 68 which further includes a secondary sealing member that is retained between adjacent barrier member modules, said secondary sealing member having a density less than the liquid for allowing floatation thereof when the liquid is present for minimizing the entry of contaminants into the chamber when the selected portion of the barrier member is above the upper surface of the housing.

71. A movable barrier floodwall as recited in claim 55 which further includes a secondary sealing member that is retained between adjacent barrier member modules, said secondary sealing member having a density less than the liquid for allowing floatation thereof when the liquid is present in the chamber for minimizing the entry of contaminants into the chamber when the selected portion of the barrier member is above the upper surface of the housing.

72. A movable barrier floodwall system including:
   a) a housing having a chamber formed by a base member, a first side panel member, a second side panel member, a left end member, and a right end member;
   b) a barrier member being vertically movable interior of said chamber, said barrier member having a selected density for allowing floatation thereof as and when a liquid is present interior of said chamber for extending a selected portion of said barrier member above an upper surface of said housing;

c) a protective cap assembly that is carried by and mounted on said barrier member and moves therewith; said protective cap assembly including a cap member and an elongated perimeter seal attached thereto, the protective cap assembly is pivotally mounted thereto for allowing said cap member and said elongated perimeter seal to be rotated a selected arc degrees with respect to the barrier member only when said cap member has been elevated a selected distance from said upper surface by and with said barrier member; and wherein, said elongated perimeter seal is configured for contacting an upper surface of said housing when and as said barrier member is in a retracted and lowered condition for limiting the entry of foreign matter between the cap member and the upper surface.

73. A movable barrier floodwall as recited in claim 72 wherein said cap member provides an extension of said barrier member after said cap member has been rotated a selected arc degrees with respect to the barrier member, and a portion of said elongated perimeter seal contacts a flat surface of said barrier member for minimizing the passage of the fluid there between.

74. A movable barrier floodwall as recited in claim 73 wherein said protective cap assembly includes a rotating device for rotating the cap member a selected arc degrees.

75. A movable barrier floodwall as recited in claim 72 wherein said protective cap assembly includes a rotating device for rotating the cap member a selected arc degrees.

76. A movable barrier floodwall as recited in claim 75 wherein said rotating device includes a cam and cam track arrangement.

77. A movable barrier floodwall as recited in claim 75 wherein said rotating device includes a cam and cam track arrangement cooperating with a biasing device for simultaneously controlling the rotation of the cap member and seal as the barrier member is elevated by said fluid.

78. A movable barrier floodwall as recited in claim 72 wherein said rotating device includes a cam and cam track arrangement cooperating with a biasing device for simultaneously controlling the rotation of the cap member and seal as the barrier member is elevated by said fluid.

79. A movable barrier floodwall system including:
a) a housing having a chamber formed by a base member, a first side panel member, a second side panel member, a left end member, and a right end member; said housing being located at a bank of a river.
b) a barrier member being vertically movable interior of said chamber, said barrier member having a selected density for allowing floatation thereof as and when a liquid is present interior of said chamber;
c) at least one first pump assembly having an inlet port and an outlet port, said inlet port being in fluidic communication with the river and the liquid contained therein, said liquid having a selected liquid density greater than the selected density of the barrier member, said outlet port being in fluidic communication with said chamber by way of a distribution manifold assembly; and
wherein, each first pump is selectively actuated by a control system for drawing the liquid from the river for filling said chamber with said liquid thereby causing said barrier member to float within said chamber for extension thereof above an upper surface of said housing.

80. A movable barrier floodwall system including:
a) a housing having a chamber formed by a base member, a first side panel member, a second side panel member, a left end member, and a right end member;
b) a barrier member being vertically movable interior of said chamber, said barrier member having a selected density for allowing floatation thereof as and when a liquid is present interior of said chamber;
c) at least one first pump assembly having an inlet port and an outlet port, said inlet port being in fluidic communication with a supply of the liquid by way of a selectively sized conduit that is disposed beneath the housing, said liquid having a selected liquid density greater than the selected density of the barrier member, said outlet port being in fluidic communication with said chamber by way of a distribution manifold assembly; and
wherein, each first pump is selectively actuated by a control system for filling said chamber with said liquid for causing said barrier member to float within said chamber for extending a selected portion of said barrier member above an upper surface of said housing.

81. A movable barrier floodwall system including:
a) a housing having a chamber formed by a base member, a first side panel member, a second side panel member, a left end member, and a right end member;
b) a barrier member being vertically movable interior of said chamber, said barrier member having a selected density for allowing floatation thereof as and when a liquid is present interior of said chamber;
c) at least one first pump assembly having an inlet port and an outlet port, said inlet port being in fluidic communication with a supply of the liquid, said liquid having a selected liquid density greater than the selected density of the barrier member, said outlet port being in fluidic communication with said chamber by way of a distribution manifold assembly said distribution manifold system being selectively sized and graduated for providing uniform flow and pressure in conduits connecting said manifold assembly with said chamber; and
wherein, each first pump is selectively actuated by a control system for filling said chamber with said liquid for causing said barrier member to float within said chamber for extending a selected portion of said barrier member above an upper surface of said housing.

82. A movable barrier floodwall system including:
a) a housing having a chamber formed by a base member, a first side panel member, a second side panel member, a left end member, and a right end member;
b) a barrier member being elongated and vertically movable interior of said chamber, said barrier member having a selected density for allowing flatation thereof as and when a liquid is present interior of said chamber for extending a selected portion of said barrier member above an upper surface of said housing, the barrier member further includes a plurality of barrier modules that are linearly aligned in the chamber, said barrier member further including an elongated vertical elastomer seal member that sealingly connects each adjacent barrier module, said elongated vertical elastomer seal member being shaped for allowing independent relative movement between adjacent barrier modules and each elongated elastomer vertical seal member is hydrostatically activated by a pressure of a fluid therebehind.

83. A movable barrier floodwall system including:
a) a housing having a chamber formed by a base member, a first side panel member, a second side panel member, a left end member, and a right end member;
b) an elongated barrier member being vertically movable interior of said chamber, said barrier member having a selected density for allowing floatation thereof as and when a liquid is present interior of said chamber for extending a selected portion of said barrier member above an upper surface of said housing;
c) a first bumper and a second bumper, said first bumper being removably fastened to an upper portion of the second side panel member, said second bumper being movably attached to an upper portion of said first side panel member;
d) a biasing device configured for urging said second bumper to and towards a flat side of said elongated barrier member; and
wherein said first bumper and said second bumper cooperate as components of a silt restricting system for minimizing the entry of contaminants into said chamber.

84. A movable barrier floodwall as recited in claim 83 wherein said silt restricting system further includes an intake fitting.

85. A movable barrier floodwall system including:
a) a plurality of housing members aligned in a selected abutting relationship, each housing having a chamber formed therein, each chamber being defined by a base member, a first side panel member, a second side panel member, a left end member, and a right end member, each chamber further including a plurality of standoffs extending vertically from each of said base members, each of said base members including an upper surface that forms a lower extent of the chamber, said upper surface having an elongated trough formed therein, the trough being in fluidic communication with at least one drain;
b) at least one barrier member being elongated and vertically movable interior of each of said chambers, each of said barrier members having a selected density for allowing floatation thereof as and when a liquid is present interior of its associated chamber for extending a selected portion of the barrier member above an upper surface of its associated housing;
c) a silt cleaning system that is housed interior of each chamber, each silt cleaning system being mounted in a lower interior portion of the chamber, each silt cleaning system including a spray manifold, a supply conduit being in fluidic communication with a supply of clean water, and a control valve mounted in said conduit intermediate said supply of clean water and the manifold, said manifold having a plurality of spray apertures for directing the clean water towards lower corners of the chamber, the manifold being supported in a selected spaced relationship with said base member by the standoffs and
wherein, each of said control valves is selectively and independently actuated for allowing the clean water to spray from its associated manifold for washing and carrying any accumulated silt within its associated chamber to and towards the drain.

86. A movable barrier floodwall system including:
a) a housing having a chamber formed by a base member, a first side panel member, a second side panel member, a left end member, and a right end member said chamber further including a guiding track formed into an interior surface of said second side panel;
b) a barrier member being vertically movable interior of said chamber, said barrier member having a selected density for allowing floatation thereof as and when a liquid is present interior of said chamber, said barrier member including an elongated stop member that is sized to fit into said guide track in a sliding relationship for guiding said barrier member during flotation thereof;
c) at least one first pump assembly having an inlet port and an outlet port, said inlet port being in fluidic communication with a supply of the liquid, said liquid having a selected liquid density greater than the selected density of the barrier member, said outlet port being in fluidic communication with said chamber by way of a distribution manifold assembly; and
wherein, each first pump is selectively actuated by a control system for filling said chamber with said liquid for causing said barrier member to float within said chamber for extending a selected portion of said barrier member above an upper surface of said housing.

87. A movable barrier floodwall system including:
a) a housing having a chamber formed therein and being defined by a base member, a first side panel member, a second side panel member, a left end member, and a right end member;
b) a barrier member being vertically movable interior of said chamber, said barrier member having a selected density for allowing floatation thereof as and when a liquid is present interior of said chamber;
c) at least one first pump assembly having an inlet port and an outlet port, said inlet port being in fluidic communication with a supply of the liquid by an elongated pipe, said liquid having a selected liquid density greater than the selected density of the barrier member, said outlet port being in fluidic communication with said chamber by way of a distribution manifold assembly; and
wherein, each first pump is selectively actuated by a control system for filling said chamber with said liquid being drawn in through a fitting attached to the end of the pipe distal the inlet port of said first pump, said fitting being configured for minimizing the entry of debris into the pipe, the filling of the chamber by said activated first pump causing said barrier member to float within said chamber for extending a selected portion of said barrier member above an upper surface of said housing.

88. A movable barrier floodwall system including:
a) a housing having a chamber formed by a base member, a first side panel member, a second side panel member, a left end member, and a right end member, said base member having end portions that terminate a selected distance beyond an exterior surface of said first side panel member and said second side panel member for providing a stabilizing foundation for said housing;
b) a barrier member being vertically movable interior of said chamber, said barrier member having a selected density for allowing floatation thereof as and when a liquid is present interior of said chamber;
c) at least one first pump assembly having an inlet port and an outlet port, said inlet port being in fluidic communication with a supply of the liquid, said liquid having a selected liquid density greater than the selected density of the barrier member, said outlet port being in fluidic communication with said chamber by way of a distribution manifold assembly; and wherein, each first pump is selectively actuated by a control system for filling said chamber with said liquid for causing said barrier member to float within said chamber for extending a selected portion of said barrier member above an upper surface of said housing.

89. A movable barrier floodwall system including:

a) a plurality of housing members aligned in a selected abutting relationship, each housing having a chamber formed therein, each chamber being defined by a base member, a first side panel member, a second side panel member, a left end member, and a right end member, each chamber of each housing member being configured for having an uppermost surface thereof in a level alignment with its adjacent housing member when and while a bottom surface of adjacent housing members are at different vertical elevations;

b) a barrier member being elongated and vertically movable interior of each of said chambers, each of said barrier members having a selected density for allowing floatation thereof as and when a liquid is present interior of its associated chamber for extending a selected portion of the barrier member above an upper surface of its associated housing.

90. A movable barrier floodwall system including:

a) a housing having a chamber formed by a base member, a first side panel member, a second side panel member, a left end member, and a right end member;

b) a barrier member being vertically movable interior of said chamber, said barrier member having a selected density for allowing floatation thereof as and when a liquid is present interior of said chamber;

c) at least one first pump assembly having an inlet port and an outlet port, said inlet port being in fluidic communication with a civil water supply for providing said liquid, said liquid having a selected liquid density greater than the selected density of the barrier member, said outlet port being in fluidic communication with said chamber by way of a distribution manifold assembly; and wherein, each first pump is selectively actuated by a control system for filling said chamber with said liquid for causing said barrier member to float within said chamber for extending a selected portion of said barrier member above an upper surface of said housing.

91. A movable barrier floodwall system including:

a) a housing having a chamber formed by a base member, a first side panel member, a second side panel member, a left end member, and a right end member, said base member, said first panel member, said second panel member said left end member and said right end member being individually cast of a concrete material while having selected apertures, guides and seats integrally cast therein;

b) a barrier member being vertically movable interior of said chamber, said barrier member having a selected density for allowing floatation thereof as and when a liquid is present interior of said chamber;

c) at least one first pump assembly having an inlet port and an outlet port, said inlet port being in fluidic communication with a supply of the liquid, said liquid having a selected liquid density greater than the selected density of the barrier member, said outlet port being in fluidic communication with said chamber by way of a distribution manifold assembly; and wherein, each first pump is selectively actuated by a control system for filling said chamber with said liquid for causing said barrier member to float within said chamber for extending a selected portion of said barrier member above an upper surface of said housing.

* * * * *